United States Patent [19]

Hara et al.

[11] Patent Number: 5,648,276
[45] Date of Patent: Jul. 15, 1997

[54] METHOD AND APPARATUS FOR FABRICATING A THIN FILM SEMICONDUCTOR DEVICE

[75] Inventors: Masaki Hara; Naoki Sano; Toshiyuki Sameshima; Atsushi Kohno; Mitsunobu Sekiya; Yasuhiro Kanaya; Michihisa Yano, all of Kanagawa, Japan

[73] Assignee: Sony Corporation, Tokyo, Japan

[21] Appl. No.: 250,679

[22] Filed: May 26, 1994

[30] Foreign Application Priority Data

| May 27, 1993 | [JP] | Japan | 5-148470 |
| Oct. 5, 1993 | [JP] | Japan | 5-273051 |

[51] Int. Cl.$^6$ .................................................. H01L 21/336
[52] U.S. Cl. .................... 437/21; 437/401 FT; 437/101; 437/173; 437/174
[58] Field of Search .......................... 437/21, 101, 937, 437/40 TFT, 41 TFT, 173, 174

[56] References Cited

U.S. PATENT DOCUMENTS

| 4,322,253 | 3/1982 | Pankove et al. | 437/937 |
| 4,943,837 | 7/1990 | Konishi et al. | 437/21 |
| 5,214,002 | 5/1993 | Hayashi et al. | 437/937 |
| 5,236,850 | 8/1993 | Zhang | 437/101 |
| 5,296,405 | 3/1994 | Yamazaki et al. | 437/101 |
| 5,308,998 | 5/1994 | Yamazaki et al. | 257/57 |
| 5,512,494 | 4/1996 | Tanabe | 437/21 |
| 5,529,630 | 6/1996 | Imahashi et al. | 118/665 |

FOREIGN PATENT DOCUMENTS

| 61-105869 | 5/1986 | Japan | 437/41 TFT |
| 1-51626 | 2/1989 | Japan | 437/937 |
| 2-208942 | 8/1990 | Japan | 437/40 TFT |
| 2-263799 | 10/1990 | Japan | 437/937 |
| 3-6028 | 1/1991 | Japan | 437/937 |
| 3-289140 | 12/1991 | Japan | 437/40 TFT |

OTHER PUBLICATIONS

Sera et al., "High–Performance TFT's Fabricated by XeCl Excimer Laser Annealing of Hydrogenated Amorphous–Silicon Film", IEEE Transaction on Electron Devices, vol. 36, No. 12, Dec. 1989, pp. 2868–2872.

*Primary Examiner*—Mary Wilczewski
*Attorney, Agent, or Firm*—Hill, Steadman & Simpson

[57] ABSTRACT

A method and an apparatus for fabricating a thin film semiconductor device are disclosed. An a-Si:H thin film produced on a wafer is melting-recrystallized by irradiating a laser beam to it in a laser annealing chamber to produce a polycrystalline Si thin film. The wafer is then transported to a CVD chamber without exposing it to the outside air. A gate insulating film is produced on a clean surface of the polycrystalline Si thin film in the CVD chamber. In another case, an a-Si:H thin film is melting-recrystallized in the laser annealing chamber to produce a polycrystalline Si thin film and then the wafer is transported to a hydrogenating chamber without exposing it to the outside air. Thereafter the polycrystalline Si thin film is plasma hydrogenated in the hydrogenating chamber. The method and apparatus can fabricate thin film semiconductor devices having a high performance and a high reliability with a good uniformity by making a clean and high quality semiconductor/insulator interface or by hydrogenating a semiconductor thin film without changes in electrical conductivity.

3 Claims, 20 Drawing Sheets

METHOD AND APPARATUS FOR FABRICATING A THIN FILM SEMICONDUCTOR DEVICE

BACKGROUND OF THE INVENTION

This invention relates to a method and an apparatus for fabricating a thin film semiconductor device, which may be suitably used for fabricating, for example, a thin film transistor (TFT).

In recent years, an attention is paid to TFT using a polycrystalline silicon (Si) film (hereinafter called a polycrystalline Si TFT) as a pixel switching device in an active matrix type liquid crystal display, etc. Polycrystalline Si TFTs, in most cases, have a so-called top gate structure whose gate electrode is located above its active layer as viewed from the substrate.

A typical method for fabricating the polycrystalline Si TFT having the top gate structure first produces on a substrate a hydrogenated amorphous Si thin film (hereinafter called an a-Si:H thin film) by a plasma CVD process, then crystallizes the thin film into a polycrystalline Si thin film in vacuum by using thermal or light energy, and then produces a gate insulating film on the polycrystalline Si thin film. Formation of the gate insulating film has so far been done after changing the a-Si:H thin film into the polycrystalline Si thin film and then breaking the vacuum of the processing chamber (see, for example, Extended Abstract on SSDM, 967(1990) and Report of Group on Application of Electronic Properties of Matter, JSAP Catalog No. AP902204 No. 432, 19(1990)).

Also known and widely used is a plasma hydrogenation process as a method for reducing defects of crystalline thin films (IEEE, EDL. vol. 10 (1989)123).

However, once the vacuum is broken after producing the polycrystalline Si thin film, the clean surface of the polycrystalline Si thin film tends to be contaminated by molecules of water and hydrocarbon compounds, or changes in nature due to reaction with gases (oxidation, etc). If the gate insulating film is formed on such a contaminated or changed surface of the polycrystalline Si thin film, adverse influence occurs to the performance (on current, threshold voltage, subthreshold swing factor, etc.), reliability (breakdown voltage, etc.) and uniformity (in-wafer characteristics) of a transistor fabricated.

It is also reported that the conventional plasma hydrogenation process for reducing defects of a crystalline thin film may cause large changes in electrical conductivity of the polycrystalline thin film if an $SiO_2$ film exists thereon, in particular, when the crystalline film is a polycrystalline Si thin film (Mat. Res. Symp. Proc. E5,4(1992)). That is, since the conventional plasma hydrogenation process once takes out the substrate in the outside air for this process after the polycrystalline Si thin film is formed on the substrate by the laser crystallization method, the surface of the polycrystalline Si thin film is exposed to the outside air so that a native oxide film is formed thereon. If, in this state, plasma hydrogenation of the polycrystalline Si thin film is performed, electrical conductivity of the polycrystalline Si thin film also changes by several orders of magnitude as shown in FIG. 1. This large change in electrical conductivity causes variance in characteristics of thin film semiconductor devices, and is therefore a matter to be considered.

OBJECTS AND SUMMARY OF THE INVENTION

It is therefore an object of the invention to provide a method and an apparatus for fabricating a thin film semiconductor device, capable of providing a clean and high-quality semiconductor/insulator interface, and hence capable of fabricating thin film semiconductor devices having a high performance and a high reliability with a good uniformity.

Another object of the invention is to provide a method and an apparatus for fabricating a thin film semiconductor device, capable of fabricating thin film semiconductor devices having a high performance and a high reliability with a good uniformity by hydrogenating a semiconductor thin film with no large change in electrical conductivity.

According to a first aspect of the invention, there is provided a method for fabricating a thin film semiconductor device comprising:

melting-recrystallizing at least a surface layer of a semiconductor thin film formed on a substrate while maintaining the substrate under a reduced pressure or in an inert gas atmosphere; and proceeding to a step of forming an insulating film on the melting-recrystallized semiconductor thin film while maintaining the substrate having the melting-recrystallized semiconductor thin film thereon under a reduced pressure or in an inert gas atmosphere.

According to a second aspect of the invention, there is provided a method for fabricating a thin film semiconductor device comprising:

melting-recrystallizing at least a surface layer of a semiconductor thin film formed on a substrate while maintaining the substrate under a reduced pressure or in an inert gas atmosphere; and proceeding to a step of hydrogenating the melting-recrystallized semiconductor thin film while maintaining the substrate having the melting-recrystallized semiconductor thin film thereon under a reduced pressure or in an inert gas atmosphere.

According to a third aspect of the invention, there is provided a method for fabricating a thin film semiconductor device comprising:

melting-recrystallizing at least a surface layer of a semiconductor thin film formed on a substrate while maintaining the substrate under a reduced pressure or in an inert gas atmosphere;

proceeding to a step of hydrogenating the melting-recrystallized semiconductor thin film while maintaining the substrate having the melting-recrystallized semiconductor thin film thereon under a reduced pressure or in an inert gas atmosphere; and proceeding to a step of forming an insulating film on the melting-recrystallized and hydrogenated semiconductor thin film while maintaining the substrate having the melting-recrystallized and hydrogenated semiconductor thin film thereon under a reduced pressure or in an inert gas atmosphere.

According to a fourth aspect of the invention, there is provided an apparatus for fabricating a thin film semiconductor device comprising:

a first processing chamber for melting-recrystallizing at least a surface layer of a semiconductor thin film formed on a substrate under a reduced pressure or in an inert gas atmosphere; and a second processing chamber for producing an insulating film on the melting-recrystallized semiconductor thin film, the apparatus being arranged to transport the substrate having the melting-recrystallized semiconductor thin film thereon from the first processing chamber to the second processing chamber while maintaining the substrate under a reduced pressure or in an inert gas atmosphere.

According to a fifth aspect of the invention, there is provided an apparatus for fabricating a thin film semiconductor device comprising:

a first processing chamber for melting-recrystallizing at least a surface layer of a semiconductor thin film formed on a substrate under a reduced pressure or in an inert gas atmosphere; and a third processing chamber for hydrogenating the melting-recrystallized semiconductor thin film, the apparatus being arranged to transport the substrate having the melting-recrystallized semiconductor thin film thereon from the first processing chamber to the third processing chamber while maintaining the substrate under a reduced pressure or in an inert gas atmosphere.

According to a sixth aspect of the invention, there is provided an apparatus for fabricating a thin film semiconductor device comprising:

a first processing chamber for melting-recrystallizing at least a surface layer of a semiconductor thin film formed on a substrate under a reduced pressure or in an inert gas atmosphere;

a third processing chamber for hydrogenating the melting-recrystallized semiconductor thin film; and a second processing chamber for producing an insulating film on the melting-recrystallized and hydrogenated semiconductor thin film, the apparatus being arranged to transport the substrate having the melting-recrystallized semiconductor thin film thereon from the first processing chamber to the third processing chamber while maintaining the substrate under a reduced pressure or in an inert gas atmosphere, and to transport the substrate having the melting-recrystallized and hydrogenated semiconductor thin film thereon from the third processing chamber to the second processing chamber while maintaining the substrate under a reduced pressure or in an inert gas atmosphere.

In the methods for fabricating a thin film semiconductor device according to the first, second and third aspects of the invention, melting-recrystallization of the semiconductor thin film may be achieved by irradiating energy to the semiconductor thin film. More specifically, irradiation of the energy may use a laser beam or light from a lamp (infrared ray lamp, ultraviolet ray lamp, or the like). In a preferred embodiment of the methods for fabricating a thin film semiconductor device according to the first, second and third aspects of the invention, melting-recrystallization is achieved by irradiating a laser beam to the semiconductor thin film.

In the methods for fabricating a thin film semiconductor device according to the first and third aspects of the invention, the insulating film may be formed, for example, by a CVD process. In a preferred embodiment of the methods for fabricating a thin film semiconductor device according to the first and third aspects of the invention, the insulating film is produced by a plasma CVD process.

In the methods for fabricating a thin film semiconductor device according to the second and third aspects of the invention, the semiconductor thin film subjected to melting-recrystallization is typically hydrogenated by holding the substrate having the semiconductor thin film thereon after melting-recrystallization in an excited hydrogen gas atmosphere.

In the methods for fabricating a thin film semiconductor device according to the second and third aspects of the invention, the semiconductor thin film subjected to melting-recrystallization is preferably hydrogenated by using a hydrogen gas excited by electron cyclotron resonance while holding the substrate having the semiconductor thin film after melting-recrystallization in a hydrogen gas atmosphere under pressure not larger than 10 mTorr.

In the apparatuses for fabricating a thin film semiconductor device according to the fourth, fifth and sixth aspects of the invention, melting-recrystallization of the semiconductor thin film is achieved by irradiating a laser beam or light from a lamp (infrared ray lamp, ultraviolet ray lamp, or the like) in the same manner as the methods for fabricating a thin film semiconductor device according to the first, second and third aspects of the invention.

In the apparatuses for fabricating a thin film semiconductor device according to the fourth and sixth aspects of the invention, the insulating film may be formed by a CVD process such as plasma CVD process.

In the apparatuses for fabricating a thin film semiconductor device according to the fourth, fifth and sixth aspects of the invention, the first processing chamber is typically a vacuum chamber having a window for irradiating light therethrough.

In the apparatuses for fabricating a thin film semiconductor device according to the fourth and sixth aspects of the invention, the third processing chamber is typically a vacuum chamber having a hydrogen gas inlet and an electrode assembly for exciting the hydrogen gas. Preferably, the electrode assembly has parallel flat electrodes one of which opposed to the semiconductor thin film is a mesh electrode.

The method for fabricating a thin film semiconductor device according to the first aspect of the invention can produce the insulating film on a clean surface of the polycrystalline semiconductor thin film without exposing it to the atmospheric air after changing a semiconductor thin film into the polycrystalline semiconductor thin film by melting-recrystallization. As a result, the method promises a clean, high-quality semiconductor/insulator interface, and can thereby fabricate thin film semiconductor devices having a high performance and a high reliability with a good uniformity.

The method for fabricating a thin film semiconductor device according to the second aspect of the invention can hydrogenate the polycrystalline semiconductor thin film while maintaining the surface of the polycrystalline semiconductor thin film clean without exposing it to the atmospheric air after changing a semiconductor thin film into the polycrystalline semiconductor thin film by melting-recrystallization. As a result, the method can preclude extraordinary changes in electrical conductivity which the conventional plasma hydrogenation process will cause, and can thereby fabricate thin film semiconductor devices having a high performance and a high reliability with a good uniformity.

The method for fabricating a thin film semiconductor device according to the third aspect of the invention can produce the insulating film on a clean surface of the polycrystalline semiconductor thin film and can hydrogenate the polycrystalline semiconductor thin film without exposing the polycrystalline semiconductor thin film to the atmospheric air after being changed from a semiconductor thin film by melting-recrystallization. As a result, the method promises a clean, high-quality semiconductor/insulator interface, precludes extraordinary changes in electrical conductivity which the conventional plasma hydrogenation process will cause, and can thereby fabricate thin film semiconductor devices having a high performance and a high reliability with a good uniformity.

The apparatus for fabricating a thin film semiconductor device according to the fourth aspect of the invention can make a clean and high-quality semiconductor/insulator interface in the same manner as the method for fabricating a thin film semiconductor device according to the first aspect of the invention, and can therefore fabricate thin film semiconductor devices having a high performance and a high reliability with a good uniformity.

The apparatus for fabricating a thin film semiconductor device according to the fifth aspect of the invention can hydrogenate the polycrystalline semiconductor thin film while maintaining its surface clean in the same manner as the method for fabricating a thin film semiconductor device according to the second aspect of the invention, and can therefore preclude extraordinary changes in electrical conductivity which the conventional plasma hydrogenation process will cause. As a result, the apparatus can fabricate thin film semiconductor devices having a high performance and a high reliability with a good uniformity.

The apparatus for fabricating a thin film semiconductor device according to the sixth aspect of the invention can make a clean and high-quality semiconductor/insulator interface and can hydrogenate the polycrystalline semiconductor thin film while maintaining its surface clean in the same manner as the method for fabricating a thin film semiconductor device according to the third aspect of the invention. As a result, the apparatus precludes extraordinary changes in electrical conductivity which the conventional plasma hydrogenation process will cause, and can thereby fabricate thin film semiconductor devices having a high performance and a high reliability with a good uniformity.

The above, and other, objects, features and advantage of the present invention will become readily apparent from the following detailed description thereof which is to be read in connection with the accompanying drawings.

DESCRIPTION OF THE PREFERRED EMBODIMENTS

Figure 1:
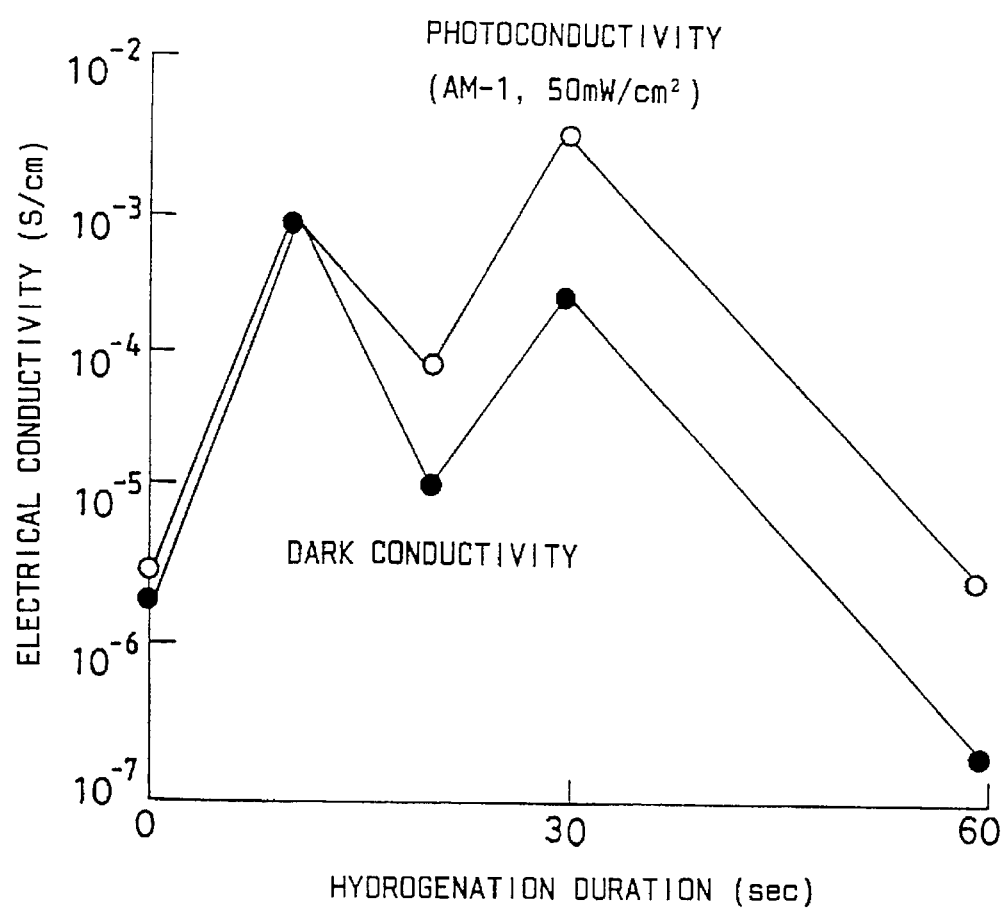
FIG. 1 is a graph showing a result of measurement of dependences of dark conductivity and photoconductivity of a polycrystalline Si thin film on hydrogenation duration during plasma hydrogenation in case that the thin film is produced by plasma hydrogenation after breaking vacuum subsequent to melting re-crystallization by irradiation of a laser beam.

Embodiments of the invention are described below with reference to the drawings. In all of the drawings of the embodiments, the same or equivalent elements are labelled with common reference numerals.

First explained is a multi-chamber type thin film semiconductor device fabricating apparatus to be used for fabricating a polycrystalline Si TFT in embodiments of the invention.

Figure 2:
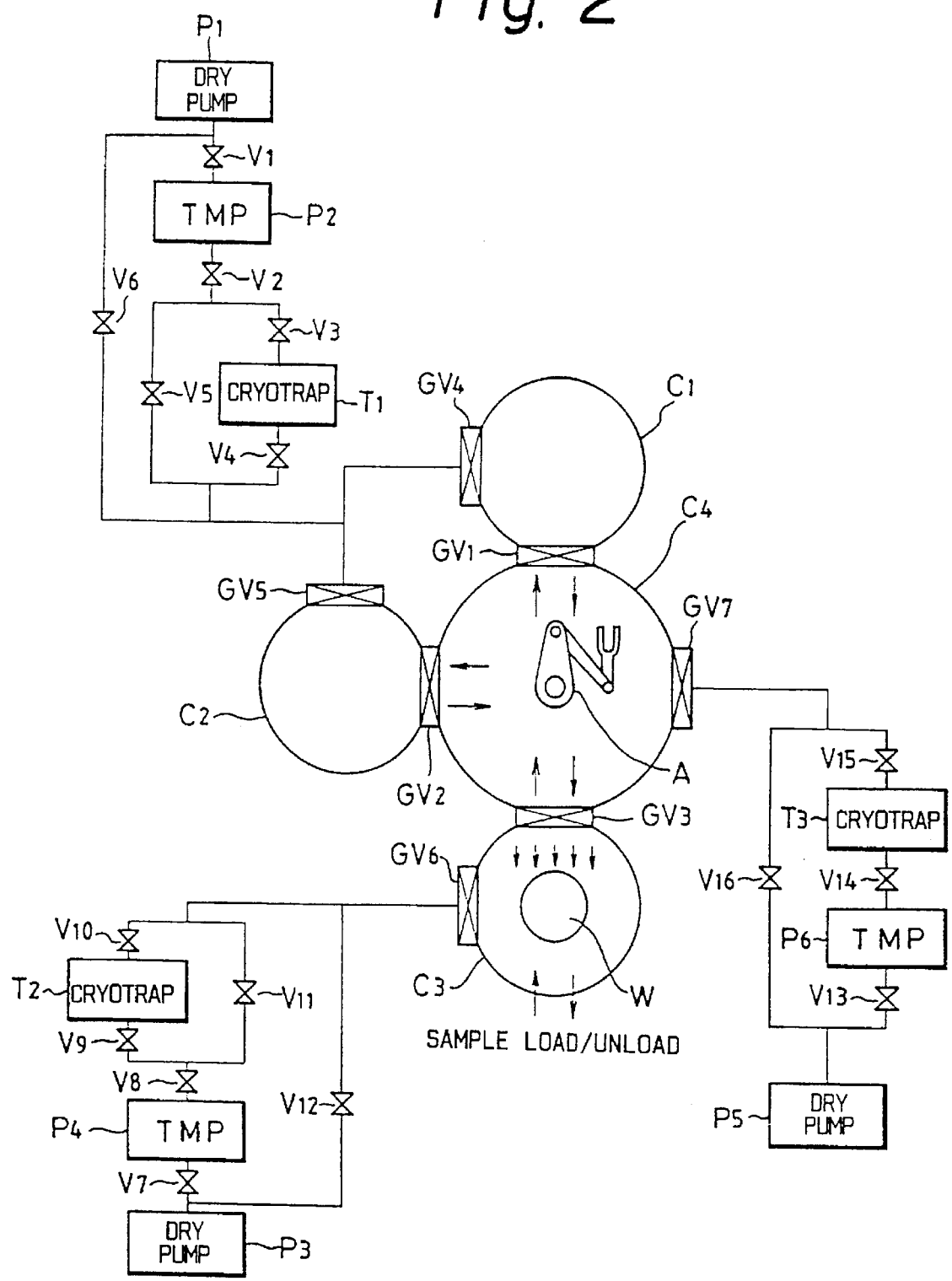
FIG. 2 is a schematic view of a multi-chamber type apparatus for fabricating a thin film semiconductor device which is used in embodiments of the invention.

As shown in FIG. 2, the thin film semiconductor device fabricating apparatus includes a CVD chamber $C_1$ for producing an insulating film, CVD chamber $C_2$ for producing an a-Si:H thin film, laser annealing chamber $C_3$ and robot chamber $C_4$ for transporting samples from one to another of the chambers. In the robot chamber $C_4$, a robot arm A transports samples.

In this case, the CVD chambers $C_1$, $C_2$ are configured to be evacuated by a vacuum evacuation system including a dry pump $P_1$, turbo-molecular pump (TMP) $P_2$ and cryotrap $T_1$. $V_1$ to $V_6$ denote valves. The laser annealing chamber $C_3$ is configured to be evacuated by a vacuum evacuation system including a dry pump $P_3$, TMP $P_4$ and cryotrap $T_2$. $V_7$ to $V_{12}$ denote valves. The robot chamber $C_4$ is configured to be evacuated by a vacuum evacuation system including a dry pump $P_5$, TMP $P_6$ and cryotrap $T_3$. $V_{13}$ to $V_{16}$ denote valves.

Figure 3:
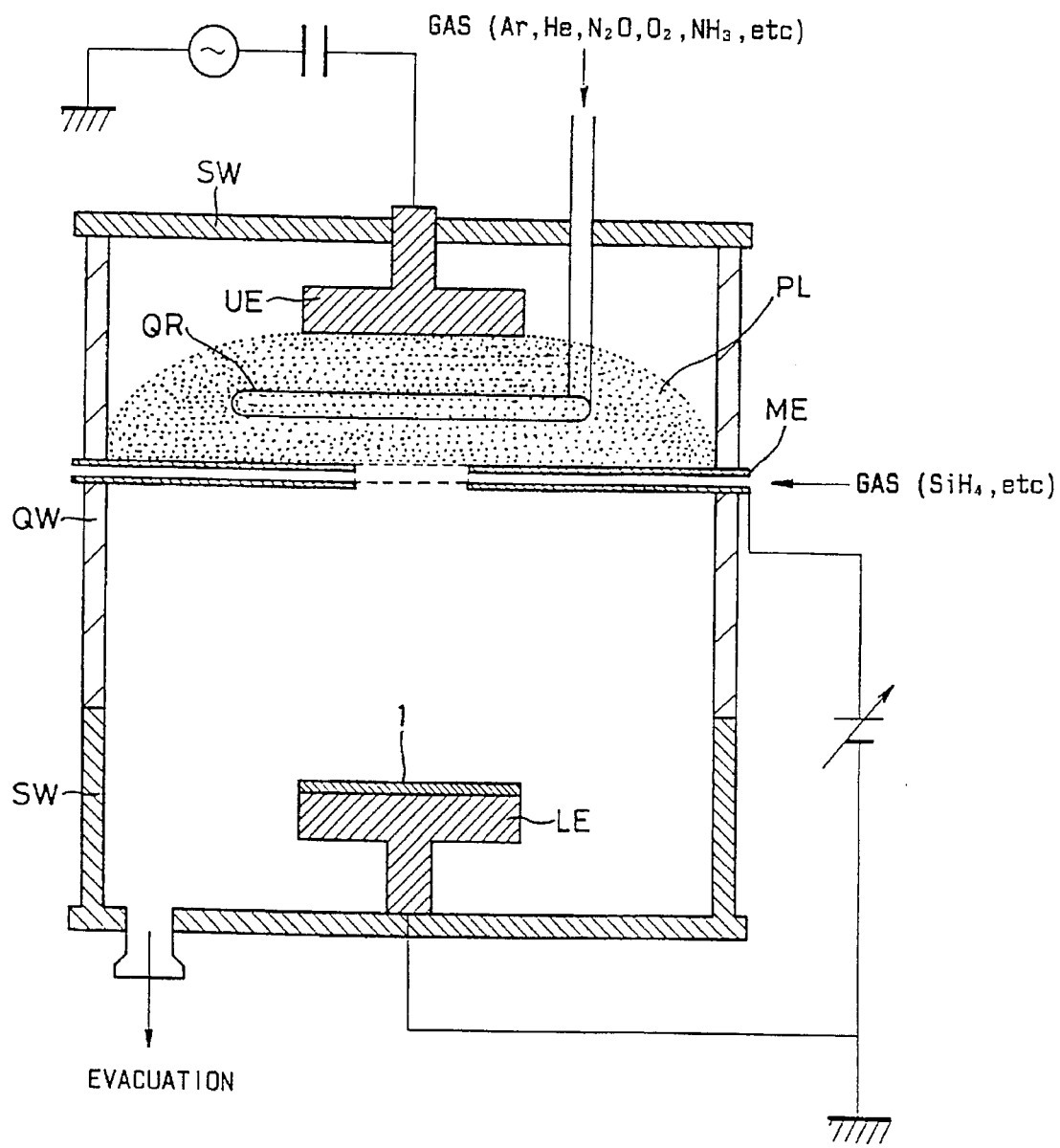
FIG. 3 is a cross-sectional view of an exemplary structure of a CVD chamber in the apparatus for fabricating a thin film semiconductor device shown in FIG. 2.

In the CVD chambers $C_1$, $C_2$, an insulating film and an a-Si:H thin film are produced, respectively, by a plasma CVD process which was proposed by the present Applicant and called a remote plasma CVD process (U.S. application Ser. No. 909,660). An exemplary arrangement of the CVD chambers $C_1$, $C_2$ is shown in FIG. 3 in which SW refers to a stainless steel outer wall, QW to a quartz outer wall, UE to an upper electrode, LE to a lower electrode, ME to a mesh electrode, and QR to a quartz ring having a number of holes (not shown). The lower electrode LE is connected to ground, and the upper electrode UE is supplied with high frequency power. The mesh electrode ME is supplied with a variable voltage. To effect remote plasma CVD in the CVD chamber, after holding a sample such as a glass wafer 1 on the lower electrode LE, while introducing a Si source material, such as $SiH_4$ gas, to the CVD chamber from the exterior and also introducing a gas (Ar, He, $N_2O$, $O_2$, $NH_3$, etc.) corresponding to the material of a film to be produced into the quartz ring QR and further through the holes to the CVD chamber, high frequency power is applied to the upper electrode UE, to thereby generate a plasma PL above the mesh electrode ME and produce a desired film on the glass wafer 1.

Figure 4:
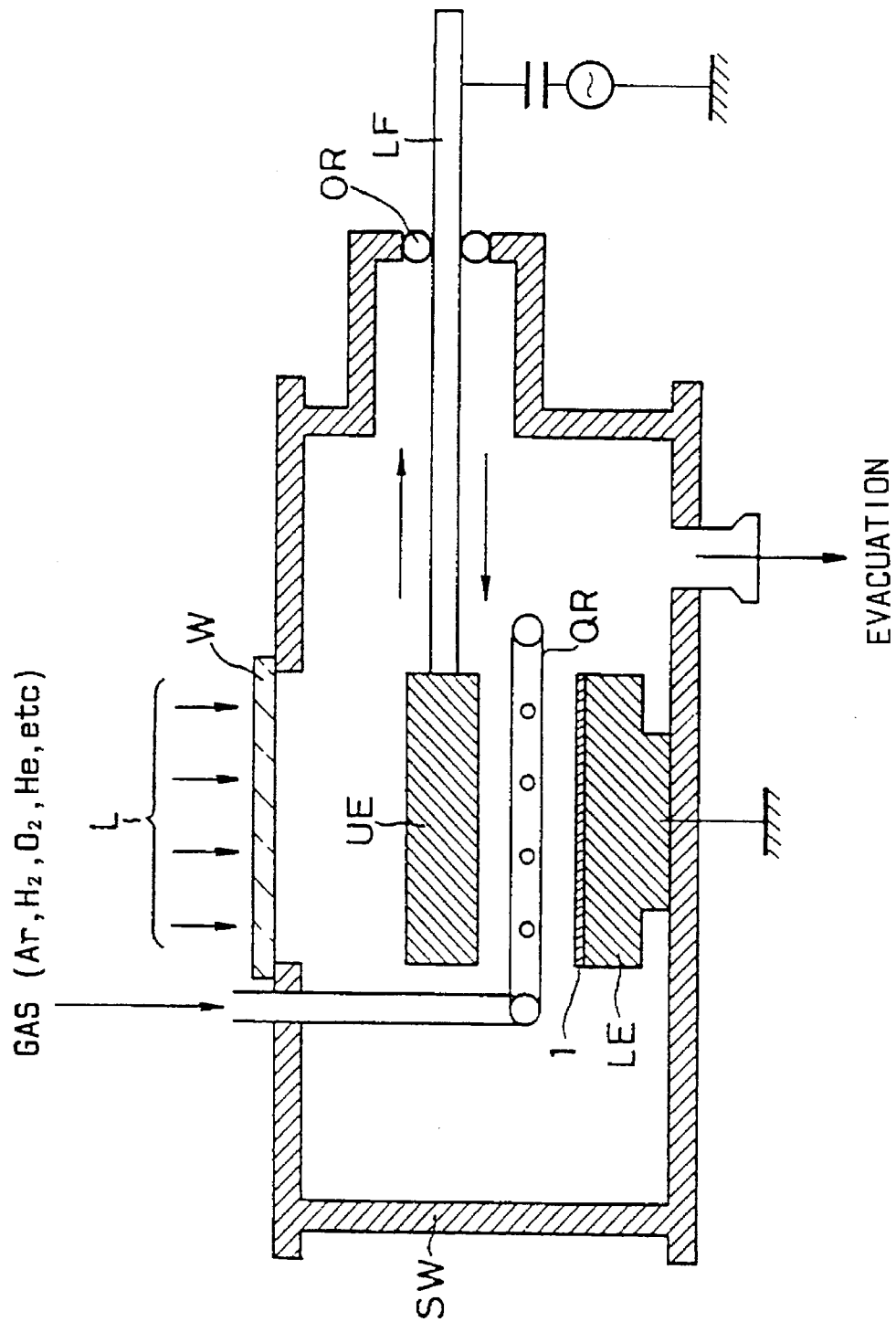
FIG. 4 is a cross-sectional view of an exemplary structure of a laser annealing chamber in the apparatus for fabricating a thin film semiconductor device shown in FIG. 2.

An exemplary arrangement of the laser annealing chamber $C_3$ is shown in FIG. 4 in which SW refers to a stainless steel outer wall, UE to an upper electrode, LE to a lower electrode, and QR to a quartz ring having a number of holes. The upper electrode UE can be linearly moved by a linear feedthrough LF. Still in FIG. 4, OR denotes an O ring, and W denotes a quartz window. To effect laser annealing in the laser annealing chamber $C_3$, after holding a sample such as a glass wafer 1 on the lower electrode LE, while introducing a gas (Ar, $H_2$, $O_2$, He, etc.) used as the atmosphere from the exterior into the quartz ring QR and further through the holes into the laser annealing chamber $C_3$, a laser beam L generated by, for example, an excimer laser provided in the exterior is irradiated to the glass wafer 1 through the quarts window W in the gas atmosphere. Upon the irradiation, the upper electrode UE is moved to a slightly deviated position from the lower electrode LE by the linear feedthrough LF such that the upper electrode UE disturb irradiation of the laser beam L.

Next explained is a method for fabricating a polycrystalline Si TFT with the thin film semiconductor device fabricating apparatus having the construction explained above.

FIGS. 5A through 5H show a method for fabricating an n-channel polycrystalline Si TFT according to a first embodiment of the invention.

Figure 5A:
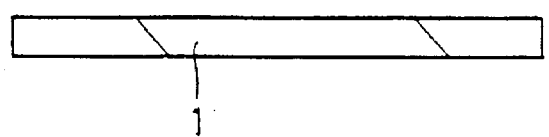
FIGS. 5A, 5B, 5C, 5D, 5E, 5F, 5G and 5H are cross-sectional views for explaining a method for fabricating an n-channel polycrystalline Si TFT according to a first embodiment of the invention.

This method according to the first embodiment first prepares, as shown in FIG. 5A, a glass wafer 1 which has been cleaned by, for example, ultrasonic organic cleaning.

Figure 5B:
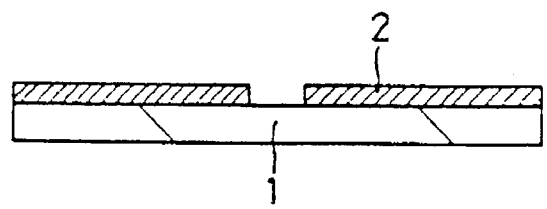
Figure 6:
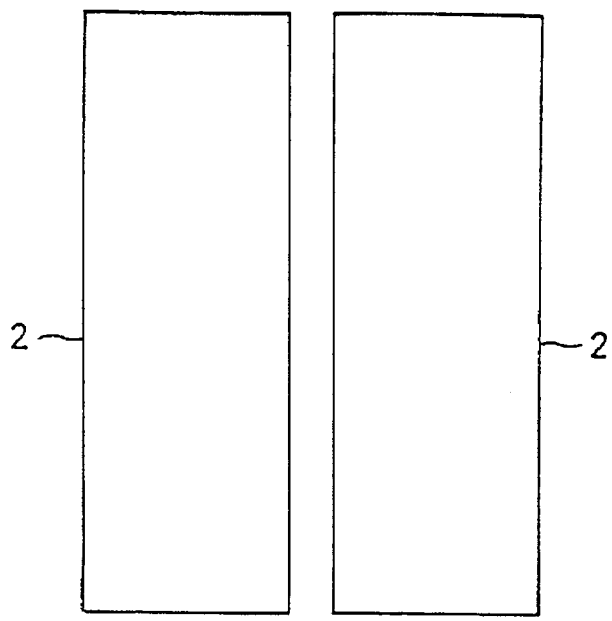
FIG. 6 is a plan view of the product shown in FIG. 5B.

Next, as shown in FIG. 5B, after a P-doped a-Si:H thin film 2 (hereinafter called a-Si:H,P thin film) is produced on the glass wafer 1 by an ordinary plasma CVD process, the a-Si:H,P thin film 2 is patterned by photolithography and etching such that selective portions thereof corresponding to the channel portions are removed. The etching may be done by, for example, a dry etching process. A plan view of the glass wafer 1 in this state is shown in FIG. 6. The a-Si:H,P thin film 2 may be, for example, 20 nm thick.

Figure 5C:
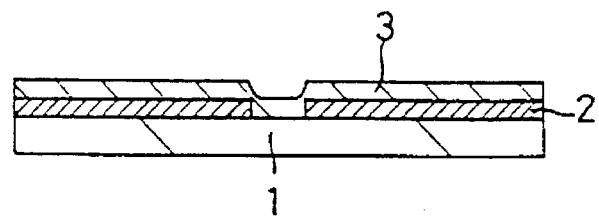

Next, as shown in FIG. 5C, an a-Si:H thin film 3 is produced by an ordinary plasma CVD process. The a-Si:H thin film 3 may be, for example, 20 nm thick.

Figure 5D:
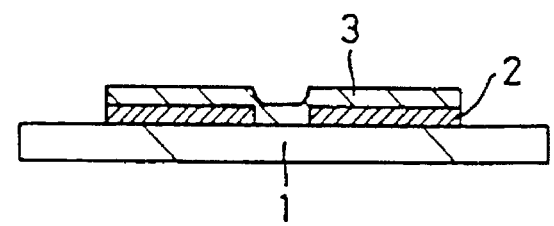
Figure 7:
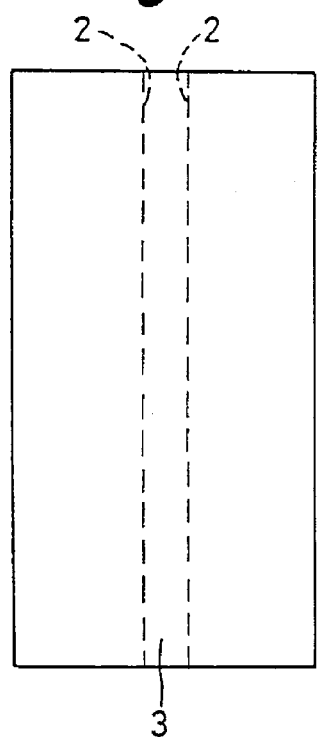
FIG. 7 is a plan view of the product shown in FIG. 5D.

Next, as shown in FIG. 5D, the a-Si:H,P thin film 2 and the a-Si:H thin film 3 are patterned in the form of islands by, for example, a dry etching process. A plan view of the glass wafer 1 in this state is shown in FIG. 7.

Figure 5E:
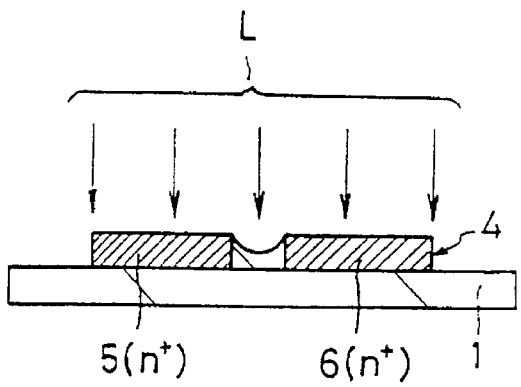

Next, the glass wafer 1 shown in FIG. 5D is put in the laser annealing chamber $C_3$ of the apparatus shown in FIG. 2. In the laser annealing chamber $C_3$, a laser beam L generated by, for example, an excimer laser is irradiated to the a-Si:H,P thin film 2 and the a-Si:H thin film 3, as shown in FIG. 5E, to change them into a polycrystalline Si thin film 4 by melting-recrystallization. In this procedure, P atoms contained in the a-Si:H,P thin film 2 are doped into selective portions of the polycrystalline Si thin film 4 other than the portion corresponding to a channel such that a source region 5 and a drain region 6 of an $n^+$-type, for example, are formed. The laser beam L may be, more specifically, a laser beam (wavelength of 308 nm) generated by a XeCl excimer laser, a laser beam (wavelength of 248 nm) generated by a KrF excimer laser, or the like.

Figure 5F:
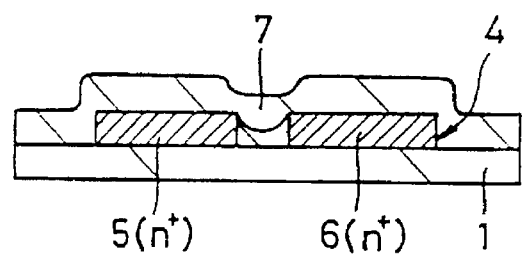

The glass wafer 1 shown in FIG. 5E is then transported, without exposing it to the outside air, to the CVD chamber $C_1$ for producing an insulating film with the robot arm A in the robot chamber $C_4$ of the apparatus shown in FIG. 2. In the CVD chamber $C_1$, a gate insulating film 7 made of, for example, $SiO_2$ is produced as shown in FIG. 5F by the remote plasma CVD process. The gate insulating film 7 may be, for example, 200 nm thick.

Figure 8:
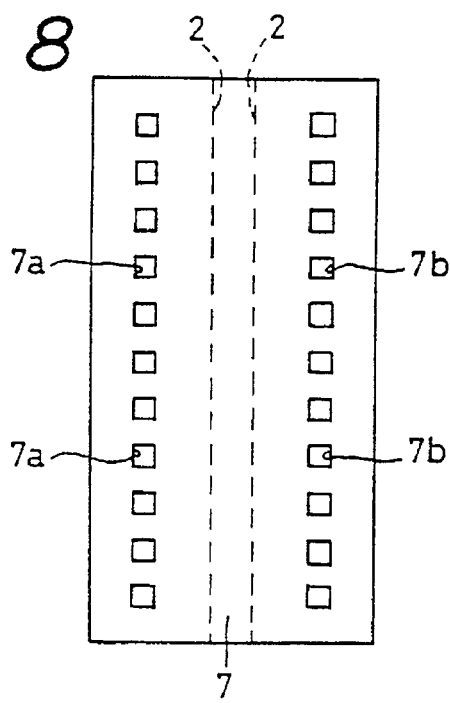
FIG. 8 is a plan view of the product shown in FIG. 5G.

The glass wafer 1 shown in FIG. 5F is then taken out from the CVD chamber $C_1$ of the apparatus shown in FIG. 2, and selective portions of the gate insulating film 7 are removed by, for example, a wet etching process, to form contact holes 7a, 7b. A plan view of the product in this state is shown in FIG. 8.

Figure 5G:
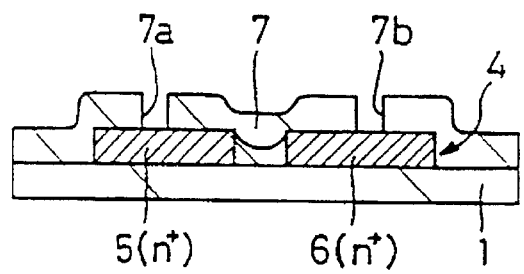
Figure 5H:
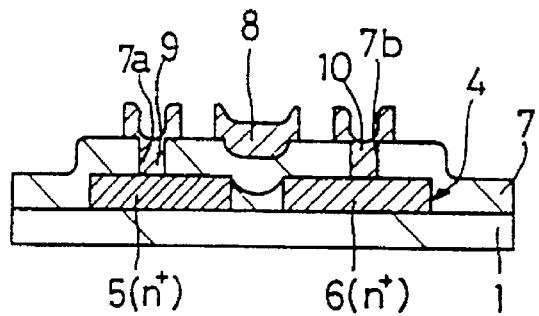
Figure 9:
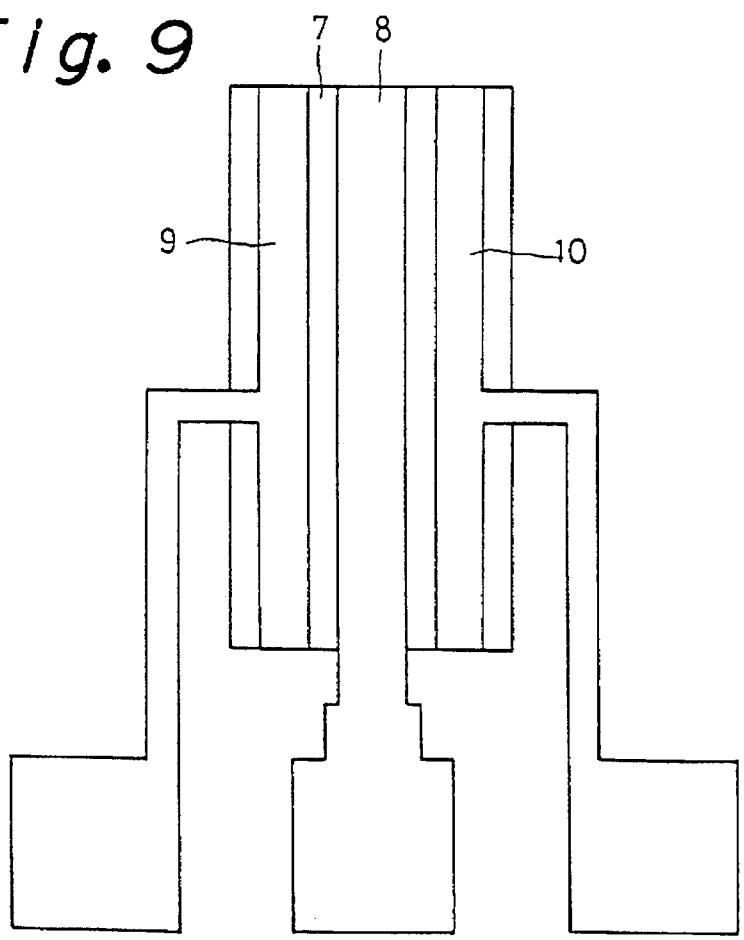
FIG. 9 is a plan view of the product shown in FIG. 5H.

An Al film, for example, is next produced on the entire surface of the glass wafer 1 shown in FIG. 5G by a vacuum evaporation process, and the Al film is subsequently patterned by, for example, a wet etching process to form a gate electrode 8, a source electrode 9 and a drain electrode 10 as shown in FIG. 5H. A plan view of the product in this state is shown in FIG. 9. The Al film may be, for example, 300 nm thick.

In these steps explained above, a desired n-channel polycrystalline Si TFT is finished.

According to the first embodiment explained above, after the polycrystalline Si thin film 4 is produced on the glass wafer 1 by melting-recrystallization caused by irradiating a laser beam L in the laser annealing chamber $C_3$ of the apparatus shown in FIG. 2, the glass wafer 1 is moved to the CVD chamber $C_1$ without being exposed to the outside air such that the gate insulating film 7 be made on the clean surface of the polycrystalline Si thin film 4 in the CVD chamber $C_1$. Therefore, a clean and high-quality interface between the polycrystalline Si thin film 4 and the gate insulating film 7 is realized, and the resulting n-channel polycrystalline Si TFT exhibits an excellency in performance (on current, threshold voltage, subthreshold swing factor, etc.), reliability (breakdown voltage, etc.) and uniformity (in-wafer characteristics).

Next explained a method for fabricating an n-channel polycrystalline Si TFT according to a second embodiment of the invention.

FIGS. 10A through 10K show a method for fabricating an n-channel polycrystalline Si TFT according to a second embodiment of the invention.

Figure 10A:
FIGS. 10A, 10B, 10C, 10D, 10E, 10F, 10G, 10H, 10I, 10J and 10K are cross-sectional views for explaining a method for fabricating an n-channel polycrystalline Si TFT according to a second embodiment of the invention.

This method first prepares, as shown in FIG. 10A, a glass wafer 1 which has been cleaned by ultrasonic organic cleaning.

Figure 10B:
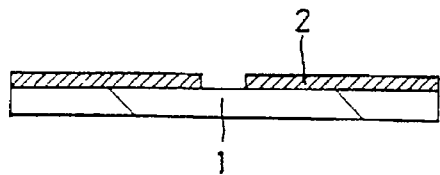

Next, as shown in FIG. 10B, after an a-Si:H,P thin film 2 is produced on the glass wafer 1 by an ordinary plasma CVD process, the a-Si:H,P thin film 2 is patterned by photolithography and etching such that selective portions thereof corresponding to the channel portions are removed. The etching may be done by, for example, a dry etching process. A plan view of the glass wafer 1 in this state appears as shown in FIG. 6.

Figure 10C:
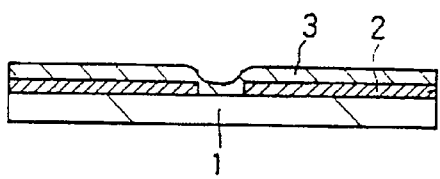

The glass wafer 1 as shown in FIG. 10B is next put in the CVD chamber $C_2$ of the apparatus shown in FIG. 2, and an a-Si:H thin film 3 is produced thereon as shown in FIG. 10C by a plasma CVD process.

Figure 10D:
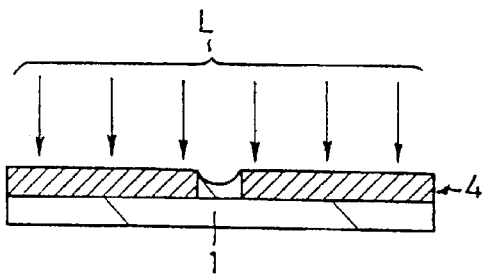

The glass wafer 1 as shown in FIG. 10C is next transported to the laser annealing chamber $C_3$ without exposing it to the outside air by using the robot arm A in the robot chamber $C_4$ of the apparatus shown in FIG. 2. In the laser annealing chamber $C_3$, a laser beam L generated by, for example, an excimer laser is irradiated to the a-Si:H,P thin film 2 and the a-Si:H thin film 3, as shown in FIG. 10D, to change them into a polycrystalline Si thin film 4 by melting-recrystallization. In this procedure, selective portions of the polycrystalline Si thin film 4 other than those defining channel portions are changed to an $n^+$-type, for example, because P atoms contained in the a-Si:H,P thin film 2 are doped thereto.

The glass wafer 1 as shown in FIG. 10D is next transported to the CVD chamber $C_1$ without exposing it to the outside air by using the robot arm A in the robot chamber $C_4$ of the apparatus shown in FIG. 2. In the CVD chamber $C_1$, a gate insulating film 7 made of, for example, $SiO_2$ is produced thereon as shown in FIG. 10E by a remote plasma CVD process.

Figure 10E:
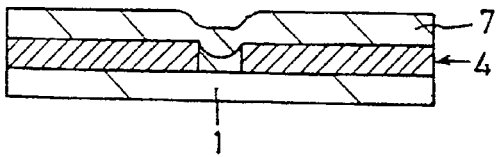
Figure 10F:
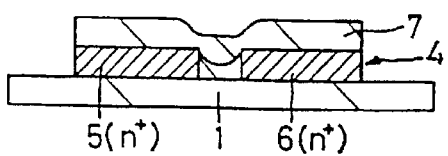

The glass wafer 1 as shown in FIG. 10E is next taken out from the CVD chamber $C_1$ of the apparatus shown in FIG. 2, and the polycrystalline Si thin film 4 and the gate insulating film 7 are patterned in the form of islands. Portions of the $n^+$-type in the polycrystalline Si thin film 4 in this state constitute the source region 5 and the drain region 6. A plan view of the product in this state appears as shown in FIG. 7.

Figure 10G:
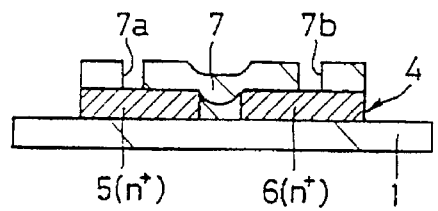

Next, as shown in FIG. 10G, selected portions of the gate insulating film 7 are removed by, for example, a wet etching process to form contact holes 7a, 7b. A plan view of the product in this state appears as shown in FIG. 8.

Figure 10H:
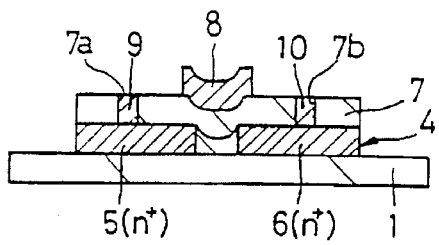
Figure 11:
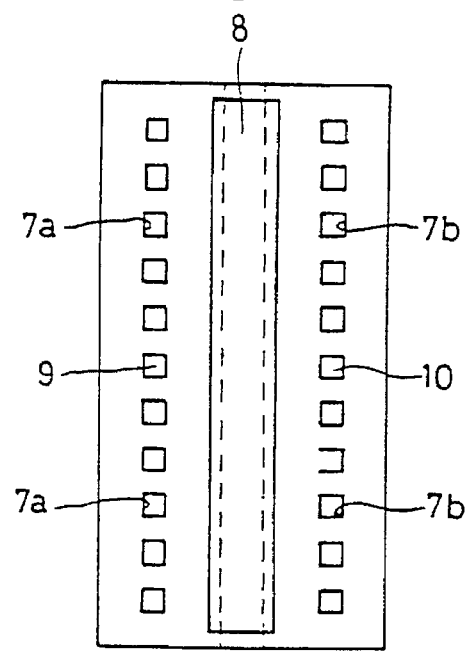
FIG. 11 is a plan view of the product shown in FIG. 10H.

An Al film is then produced on the entire surface of the glass wafer 1 shown in FIG. 10G by, for example, a vacuum evaporation process, and the Al film is subsequently patterned by, for example, a wet etching process to form a gate electrode 8, a source electrode 9 and a drain electrode 10 as shown in FIG. 10H. A plan view of the product in this state is shown in FIG. 11.

Figure 10I:
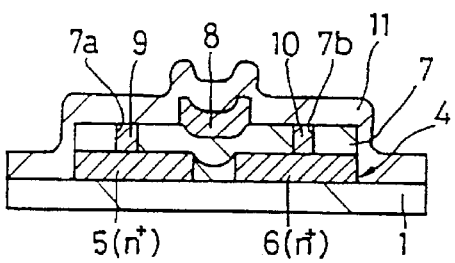

The glass wafer 1 shown in FIG. 10H is then put in the CVD chamber $C_1$ of the apparatus shown in FIG. 1, and an interlayer insulating film 11 made of, for example, $SiO_2$ is produced thereon as shown in FIG. 10I by a remote plasma CVD process. The interlayer insulating film 11 can cover side walls of the polycrystalline Si thin film 4 exposed by the patterning to prevent exposure thereof.

Figure 10J:
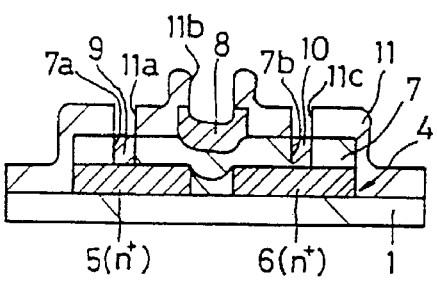
Figure 12:
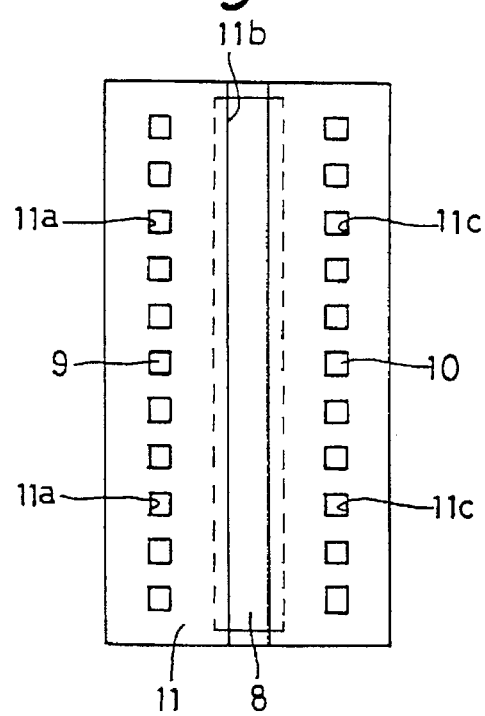
FIG. 12 is a plan view of the product shown in FIG. 10J.

Next, as shown in FIG. 10J, contact holes 11a, 11b, 11c are made by removing selective portions of the interlayer insulating film 11 by, for example, a wet etching process. A plan view of the product in this state is shown in FIG. 12.

Figure 10K:
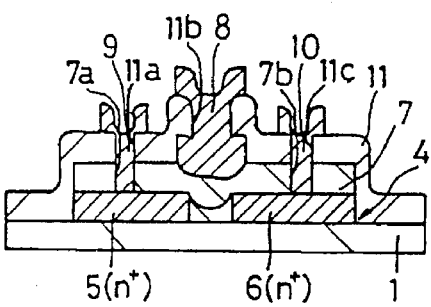

An Al film, for example, is then produced on the entire surface of the glass wafer 1 as shown in FIG. 10J by a vacuum evaporation process or the like, and the Al film is subsequently patterned by, for example, a wet etching process. Thus a gate electrode 8, a source electrode 9 and a drain electrode 10 having desired thicknesses and shapes are formed as shown in FIG. 10K. A plan view of the product in this state appears as shown in FIG. 9.

By the steps explained above, a desired n-channel polycrystalline Si TFT is finished.

According to the second embodiment explained above, formation of the a-Si:H thin film 3, formation of the polycrystalline Si thin film 4 by melting-recrystallization and formation of the gate insulating film 7 are executed respectively in the CVD chamber $C_2$, in the laser annealing chamber $C_3$ and in the CVD chamber $C_1$ of the apparatus shown in FIG. 2 without exposing the glass wafer 1 to the outside air in the middle of the process. Therefore, the method promises cleanness and high quality of the interface between the polycrystalline Si thin film 4 and the gate insulating film 7 is realized, and also prevents contamination and changes in nature of the surface of the a-Si:H thin film 3 to ensure a good quality of the polycrystalline Si thin film 4 produced by melting-recrystallization of the a-Si:H thin film 3 and the a-Si:H,P thin film 2. As a result, like in the first embodiment, the resulting n-channel polycrystalline Si TFT exhibits an excellency in performance (on current, threshold voltage, subthreshold swing factor, etc.), reliability (breakdown voltage, etc.) and uniformity (in-wafer characteristics).

Methods available for changing a semiconductor thin film into a polycrystalline semiconductor thin film are melting-recrystallization of a semiconductor thin film and solid phase growth of a semiconductor thin film. It is known that, although the latter method, i.e., solid phase growth, can make a polycrystalline semiconductor thin film with a large grain size, a polycrystalline semiconductor thin film obtained by melting-recrystallization solid has a better quality than that obtained by solid phase growth (see, for example, IEEE Trans. Electron Devices vol. 38, 2058 (1991)). Melting-recrystallization of a semiconductor thin film is therefore recommended to fabricate a device having good characteristics. In the melting-recrystallization process, when the semiconductor thin film on the glass wafer is melted, maintenance of a high temperature throughout the substrate is impossible because of a low melting point of glass. Therefore, it is preferable to use irradiation of a laser beam by an excimer laser capable of heating the semiconductor thin film alone for a short time.

Grain sizes of crystal grains in the polycrystalline semiconductor thin film obtained by melting the semiconductor thin film for a short time are restricted by the thickness of the semiconductor thin film. In addition, in case that the semiconductor thin film as the starting material includes a large amount of hydrogen like the a-Si:H thin film, there is a danger that hydrogen is explosively expelled and breaks the semiconductor thin film when the semiconductor thin film is melted. Therefore, the thicker the a-Si:H thin film, the more difficult is changing it into the polycrystalline Si thin film (see, for example, Extended Abstracts on SSDM, 967 (1990)). For these reasons, it was conventionally difficult to obtain a polycrystalline Si thin film having a large grain size (for example, 50 nm or larger) from an a-Si:H thin film at a low temperature, for example, 300° C.

To overcome this problem, one would propose to once expose a semiconductor thin film, after melted, to the outside air and to thereafter again produce a thin film and melt it. However, this approach will not succeed in increasing grain sizes of crystal grains because once a semiconductor thin film after melted is exposed to the outside air, the clean surface of the polycrystalline semiconductor thin film is contaminated by water or hydrocarbon molecules or changed in nature due to reaction of gases (oxidation, etc.). Such a contaminated or changed portion becomes a grain boundary behaving as a barrier during crystal growth, and hence prevents an increase in grain size.

Explained below with reference to FIGS. 13A through 13D is a method overcoming the problem and capable of producing a polycrystalline semiconductor thin film, in particular, a polycrystalline Si thin film, having a large grain size.

The process is started by putting a clean glass wafer 1 after ultrasonic organic cleaning, or a like method, in the CVD chamber $C_2$ of the apparatus shown in FIG. 2. In the CVD chamber $C_2$, an a-Si:H thin film 3 is produced on the glass wafer 1 as shown in FIG. 13A by a remote plasma CVD process.

Figure 13A:
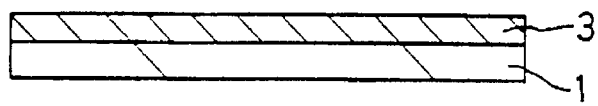
FIGS. 13A, 13B, 13C and 13D are cross-sectional views for explaining a method for producing a polycrystalline Si thin film having a large grain size.
Figure 13B:
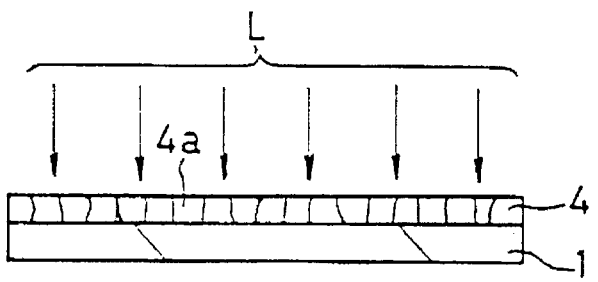

The glass wafer 1 shown in FIG. 13A is then transported to the laser annealing chamber $C_3$ without being exposed to the outside air by using the robot arm A in the robot chamber $C_4$ of the apparatus shown in FIG. 2. In the laser annealing chamber $C_3$, a laser beam L by , for example, an excimer laser is irradiated to the a-Si:H thin film 3 as shown in FIG. 13B to change it into a polycrystalline Si thin film 4 due to melting-recrystallization. Reference 4a denotes a crystal grain in the polycrystalline Si thin film 4.

Figure 13C:
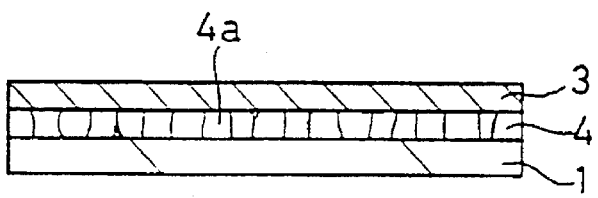

The glass wafer 1 shown in FIG. 13B is then again put in the CVD chamber $C_2$ without being exposed to the outside air by using the robot arm A in the robot chamber $C_4$ of the apparatus shown in FIG. 2. In the CVD chamber $C_2$, an a-Si:H thin film 3 is produced on the polycrystalline Si thin film 4 as shown in FIG. 13C by a remote plasma CVD process.

Figure 13D:
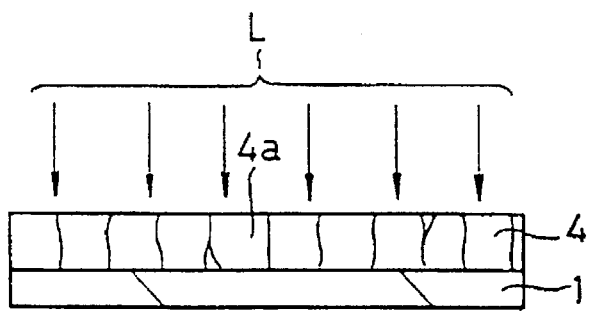

The glass wafer 1 shown in FIG. 13C is then again transported to the laser annealing chamber $C_3$ without being exposed to the outside air by using the robot arm A in the robot chamber $C_4$ of the apparatus shown in FIG. 2. In the laser annealing chamber $C_3$, a laser beam L generated by, for example, an excimer laser is irradiated to the a-Si:H thin film 3 and the polycrystalline Si thin film 4 as shown in FIG. 13D to cause melting-recrystallization thereof. As a result, a polycrystalline Si thin film 4 with a larger thickness and a larger grain size than the former polycrystalline Si thin film 4 shown in FIG. 13B is obtained.

By repeating the process including formation and melting-recrystallization of the a-Si:H thin film 3 any desired times, a desired polycrystalline Si thin film 4 having a large grain size can be obtained.

In a third embodiment of the invention, an n-channel polycrystalline Si TFT is fabricated by using the method for fabricating a polycrystalline Si film as stated above.

The n-channel polycrystalline Si TFT fabricating method according to the third embodiment, after proceeding with the process up to the step shown in FIG. 10B in the n-channel polycrystalline Si TFT fabricating method according to the second embodiment, formation of the a-Si:H thin film 3 shown in FIG. 10C and melting-recrystallization thereof using a laser beam L as shown in FIG. 10D are repeated necessary times to thereby produce a polycrystalline Si thin film 4 having an a sufficiently large grain size. For example, when formation of the a-Si:H thin film 3 and subsequent melting-recrystallization thereof are repeated three times where the a-Si:H, P thin film is 20 nm thick and the a-Si:H thin film 3 produced by one time of plasma CVD is 20 nm thick, the resulting polycrystalline thin film 4 has a thickness of 80 nm, and hence has crystal grains as large as 80 nm.

The glass wafer 1 provided thereon with the polycrystalline Si thin film 4 having a large grain size is then transported from the laser annealing chamber $C_3$ to the CVD chamber $C_1$ of the apparatus shown in FIG. 2 without being exposed to the outside air. In the CVD chamber $C_1$, a gate insulating film 7 is produced on the clean surface of the polycrystalline Si thin film 4 like in the manner shown in FIG. 10E.

Thereafter, the same steps as 10F through 10K proceed, and a desired n-channel polycrystalline Si TFT is finished.

According to the third embodiment, the process for increasing the grain size of the polycrystalline Si thin film shown in FIG. 13 is added to the n-channel polycrystalline Si TFT fabricating process according to the second embodiment. As a result, an n-channel polycrystalline Si TFT having a high performance particularly in field effect mobility as high as, for example, 500 $cm^2/V$ s or more is realized.

Next explained is a fourth embodiment of the invention.

Figure 14:
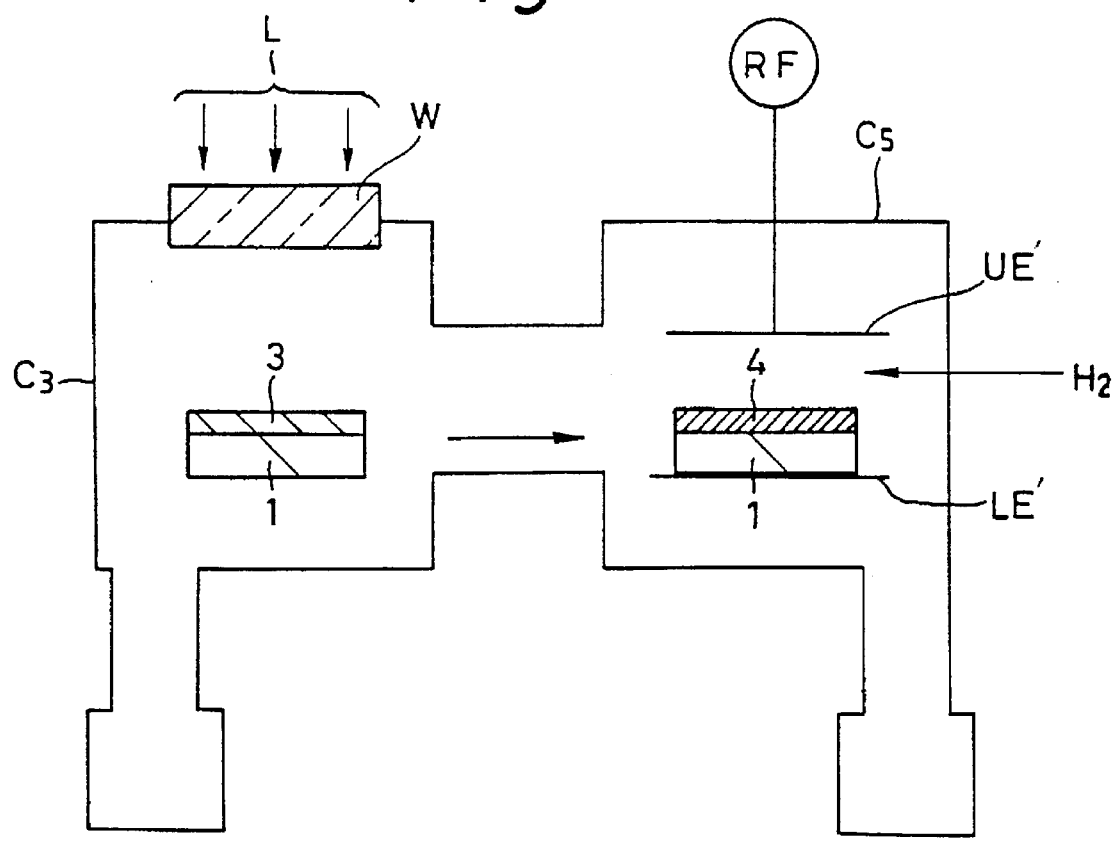
FIG. 14 is a schematic view of an apparatus for fabricating a thin film semiconductor device which is used in a fourth embodiment of the invention.

FIG. 14 shows a thin film semiconductor device fabricating apparatus used in the fourth embodiment. As shown in FIG. 14, the apparatus includes a laser annealing chamber $C_3$ having a window W for irradiating a laser beam L therethrough, and a hydrogenating chamber $C_5$ having an upper electrode UE' and a lower electrode LE' opposed to each other for changing hydrogen ($H_2$) gas introduced from the exterior into a plasma. The laser annealing chamber $C_3$ and the hydrogenating chamber $C_5$ are coupled by a vacuum transporting system (not shown). The laser annealing chamber $C_3$ and the hydrogenating chamber $C_5$ are designed to be evacuated to a pressure, for example, on the order of $2\times10^{-7}$ Torr by a vacuum evacuation system, respectively.

With the apparatus shown in FIG. 14 having the arrangement, a glass wafer 1 already provided with, for example, an a-Si:H thin film 3 thereon is put in the laser annealing chamber $C_3$. In the annealing chamber $C_3$, a laser beam L is irradiated to the a-Si:H thin film 3 through the quartz window W and makes it change into a polycrystalline Si thin film 4 due to melting-recrystallization. Thereafter, without breaking the vacuum, the glass wafer 1 is transported to the hydrogenating chamber $C_5$. In the hydrogenating chamber $C_5$, high frequency power is applied to the upper electrode UE' such that the hydrogen plasma generated between the upper electrode UE' and the lower electrode LE' hydrogenates the polycrystalline Si thin film 4 obtained by the melting-recrystallization.

Figure 15:
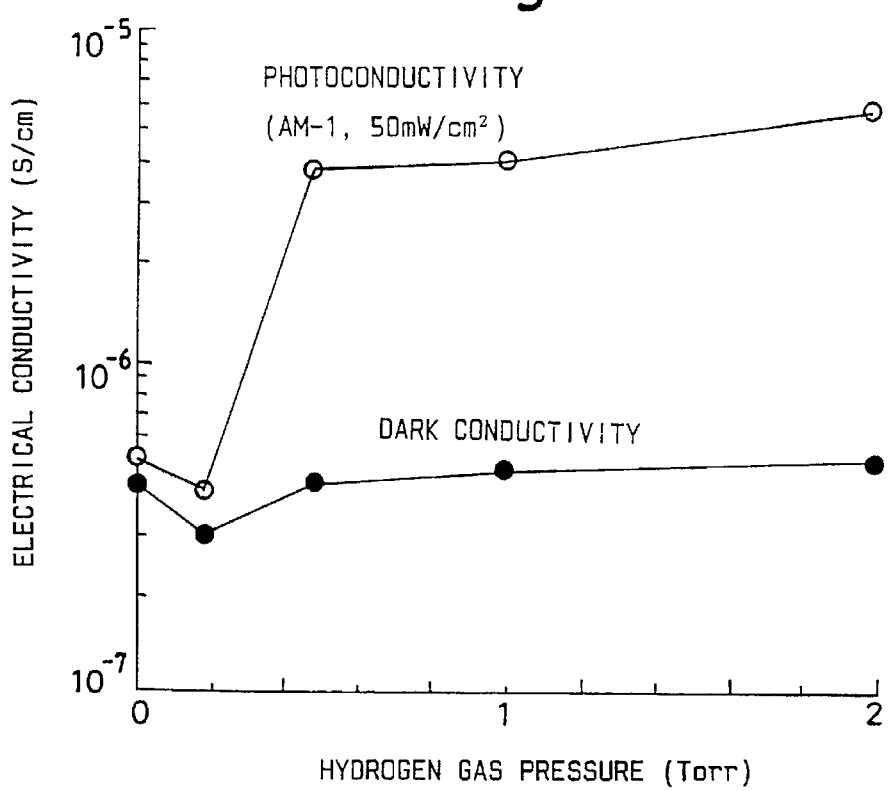
FIG. 15 is a graph showing a result of measurement of dependences of dark conductivity and photoconductivity of a polycrystalline Si thin film on hydrogen gas pressure during plasma hydrogenation in case that the thin film is produced by melting-recrystallization and plasma hydrogenation in the fourth embodiment of the invention.
Figure 16:
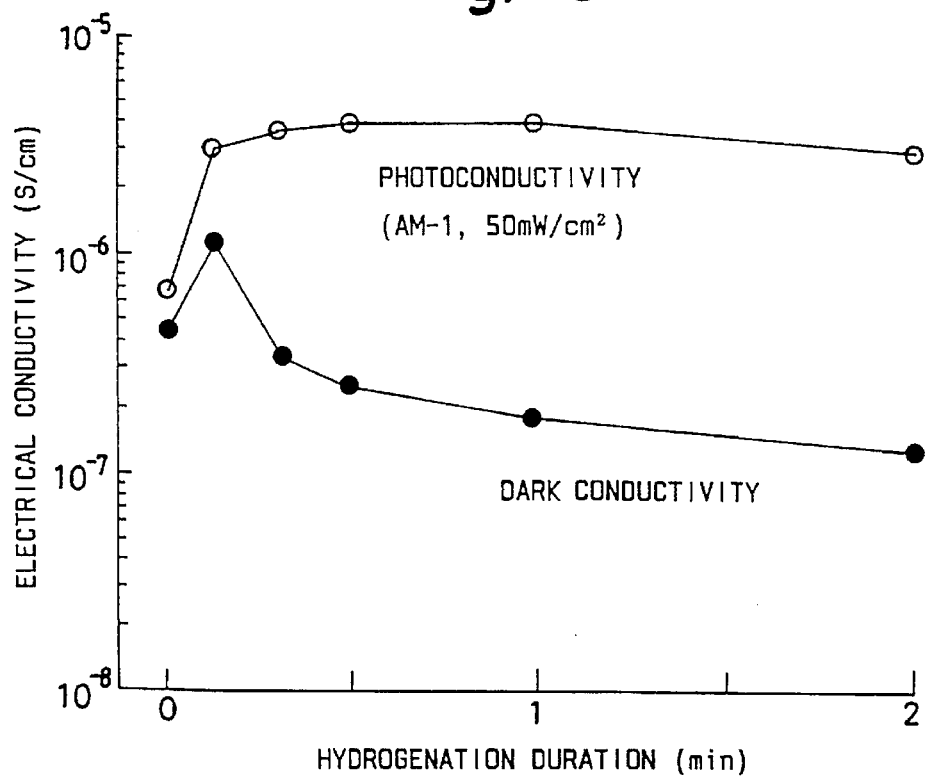
FIG. 16 is a graph showing a result of measurement of dependences of dark conductivity and photoconductivity of a polycrystalline Si thin film on hydrogenation duration during plasma hydrogenation in case that the thin film is produced by melting-recrystallization and plasma hydrogenation in the fourth embodiment of the invention.

FIG. 15 shows a result of measurement of dependences of dark conductivity and photoconductivity of a 20 nm thick polycrystalline Si thin film 4 obtained by the melting-recrystallization and the plasma hydrogenation on hydrogen gas pressure during the plasma hydrogenation under the conditions: hydrogen gas flow of 100 sccm, temperature of 270° C., high frequency power of 5 W and hydrogenation duration of 30 seconds. FIG. 16 shows a result of measurement of dark conductivity and photoconductivity of a 20 nm thick polycrystalline Si thin film 4 obtained by the melting-recrystallization and the plasma hydrogenation upon hydrogenation duration during the plasma hydrogenation under the conditions: hydrogen gas flow of 100 sccm, temperature of 270° C., high frequency power of 5 W and hydrogen gas pressure of 0.5 Torr.

FIG. 15 shows that photoconductivity becomes large with about 0.5 Torr or more of the hydrogen gas pressure. It has been confirmed from this that defects produced in the polycrystalline Si thin film 4 upon the melting-recrystallization by a laser beam L decreases. FIG. 16 shows that good plasma hydrogenation is possible with about 30 seconds or more of the hydrogenation duration. Since the characteristics shown in FIGS. 15 and 16 do not show extraordinary changes in electrical conductivity, it is recognized that stable hydrogenation has been effected. This manifests that plasma hydrogenation of the polycrystalline Si thin film 4 was carried out while the surface thereof being maintained clean by the continuous process under vacuum as explained above.

Since the fourth embodiment can also perform plasma hydrogenation of the polycrystalline Si thin film 4 by introducing it to the hydrogenating chamber $C_5$ while maintaining its surface clean after obtaining the polycrystalline Si thin film 4 by melting-recrystallization of the a-Si:H thin film 3 in the laser annealing chamber $C_3$, it can preclude extraordinary changes in electrical conductivity of the polycrystalline Si thin film 4 which would occur when the conventional plasma hydrogenation process is used. Such a high-quality polycrystalline Si thin film 4 decreases the variance in characteristics of TFT or other type thin film semiconductor devices made of the polycrystalline Si thin films 4.

Next explained is a fifth embodiment of the invention.

Figure 17:
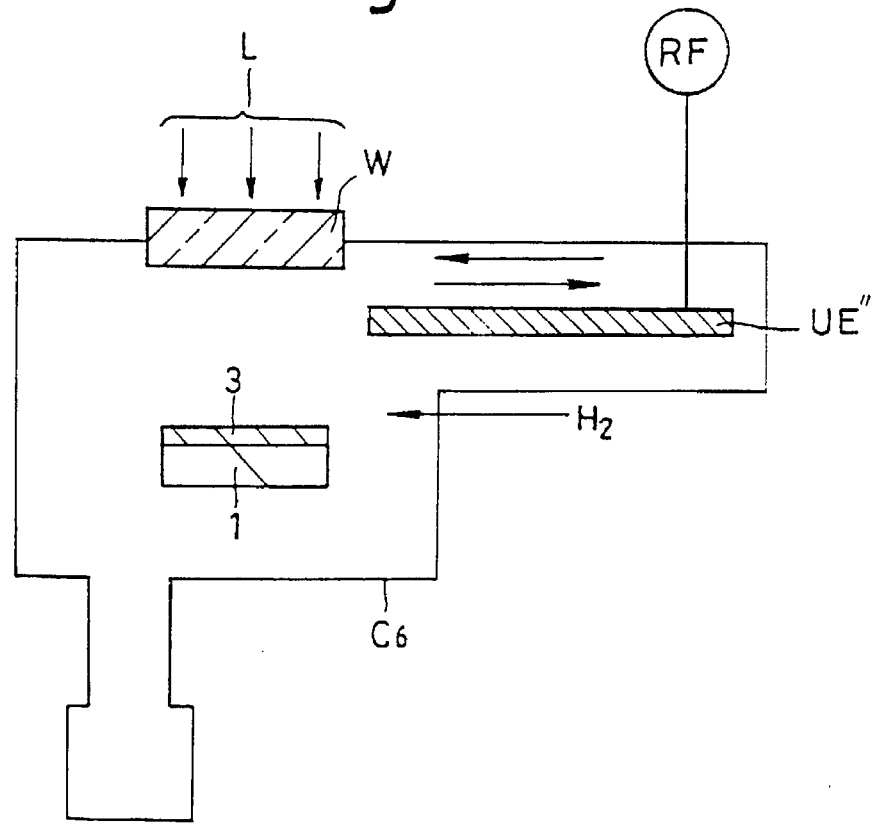
FIG. 17 is a schematic view of an apparatus for fabricating a thin film semiconductor device which is used in a fifth embodiment of the invention.

FIG. 17 shows a thin film semiconductor device fabricating apparatus used in the fifth embodiment. As shown in FIG. 17, the apparatus includes a single laser annealing and hydrogenating chamber $C_6$ incorporating a laser annealing chamber and a hydrogenating chamber. The laser annealing and hydrogenating chamber $C_6$ is designed to be evacuated by a vacuum evacuation system (not shown) to a pressure, for example, on the order to $2\times10^{-7}$ Torr. The laser annealing and hydrogenating chamber $C_6$ includes an upper electrode UE" for plasma discharge which can be moved in the right and left directions in FIG. 17 by a linear feedthrough (not shown). Although not shown, a glass wafer 1 is put on a lower electrode. The laser annealing and hydrogenating chamber $C_6$ may more specifically have the same arrangement as that of the laser annealing chamber $C_3$ shown in FIG. 4.

With the apparatus shown in FIG. 17 having the arrangement, while moving the upper electrode UE" to a position offset from above the glass wafer 1 in the laser annealing and hydrogenating chamber $C_6$, a laser beam L is irradiated to the a-Si:H thin film 3 already provided on the glass wafer 1 through a quarts window W to cause melting-recrystallization. Subsequently, after moving the upper electrode UE" to above the glass wafer 1, hydrogen gas is introduced to the laser annealing and hydrogenating chamber $C_6$, and high frequency power is applied to the upper electrode UE" to cause plasma discharge of hydrogen gas and plasma hydrogenation thereby of a polycrystalline Si thin film formed by the melting-recrystallization.

Since the fifth embodiment can also perform plasma hydrogenation of the polycrystalline Si thin film 4, like the fourth embodiment, while maintaining its surface clean after obtaining the polycrystalline Si thin film 4 by melting recrystallization of the a-Si:H thin film 3, it can preclude extraordinary changes in electrical conductivity of the polycrystalline Si thin film 4.

Next explained is a sixth embodiment of the invention.

Figure 18:
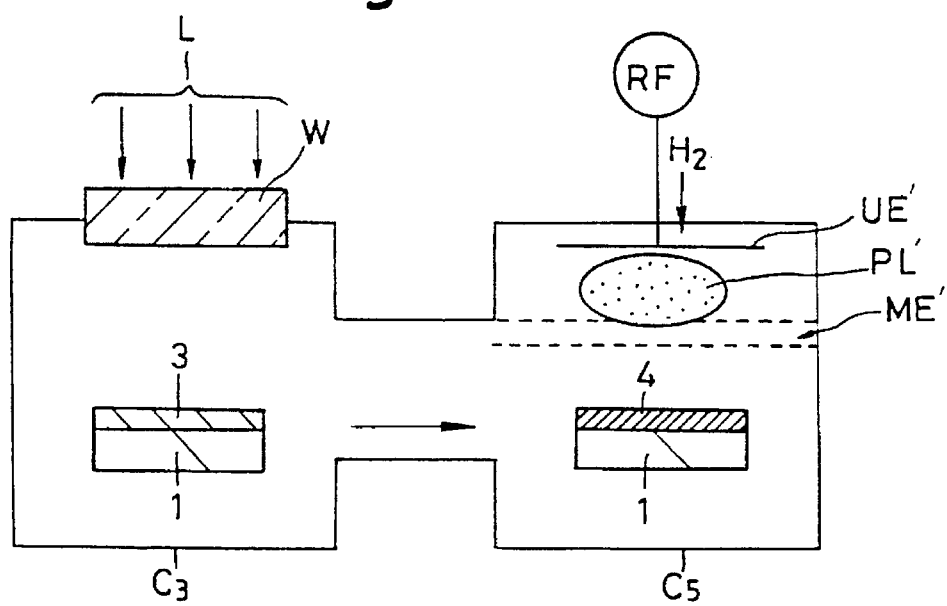
FIG. 18 is a schematic view of an apparatus for fabricating a thin film semiconductor device which is used in a sixth embodiment of the invention.

FIG. 18 shows a thin film semiconductor device fabricating apparatus used in the sixth embodiment. As shown in FIG. 18, the lower electrode in the hydrogenating chamber $C_5$ of this apparatus is a mesh electrode ME', and a hydrogen plasma PL' can be produced between the upper electrode UE' and the mesh electrode ME'. Except for these, the apparatus has the same arrangement as that of the apparatus shown in FIG. 14, of which explanation is omitted here.

With the apparatus shown in FIG. 18 having the arrangement, a laser beam L is irradiated to the a-Si:H thin film 3 on the glass wafer i in the laser annealing chamber $C_3$ to cause melting-recrystallization thereof. After that, without breaking the vacuum, the glass wafer 1 is transported to the hydrogenating chamber $C_5$. In the hydrogenating chamber $C_5$, the polycrystalline Si thin film 4 obtained by the melting-recrystallization is subjected to remote plasma hydrogenation by the hydrogen plasma generated between the upper electrode UE' and the mesh electrode ME'.

The sixth embodiment, like the fourth embodiment, precludes extraordinary changes in electrical conductivity by plasma hydrogenation of the polycrystalline Si thin film 4, and also provides the following additional advantage. That is, since the sixth embodiment results in confining the hydrogen plasma PL' used in the plasma hydrogenation between the upper electrode UE' and the mesh electrode ME', it never irradiate high-energy ions to the polycrystalline Si thin film 4 during plasma hydrogenation such that non-charged neutral hydrogen atoms alone pass through the mesh electrode ME' and contribute to hydrogenation of the polycrystalline Si thin film 4. This contributes to preventing any defect from being produced in the polycrystalline Si thin film 4 during plasma hydrogenation.

Next explained is a seventh embodiment of the invention.

Figure 19:
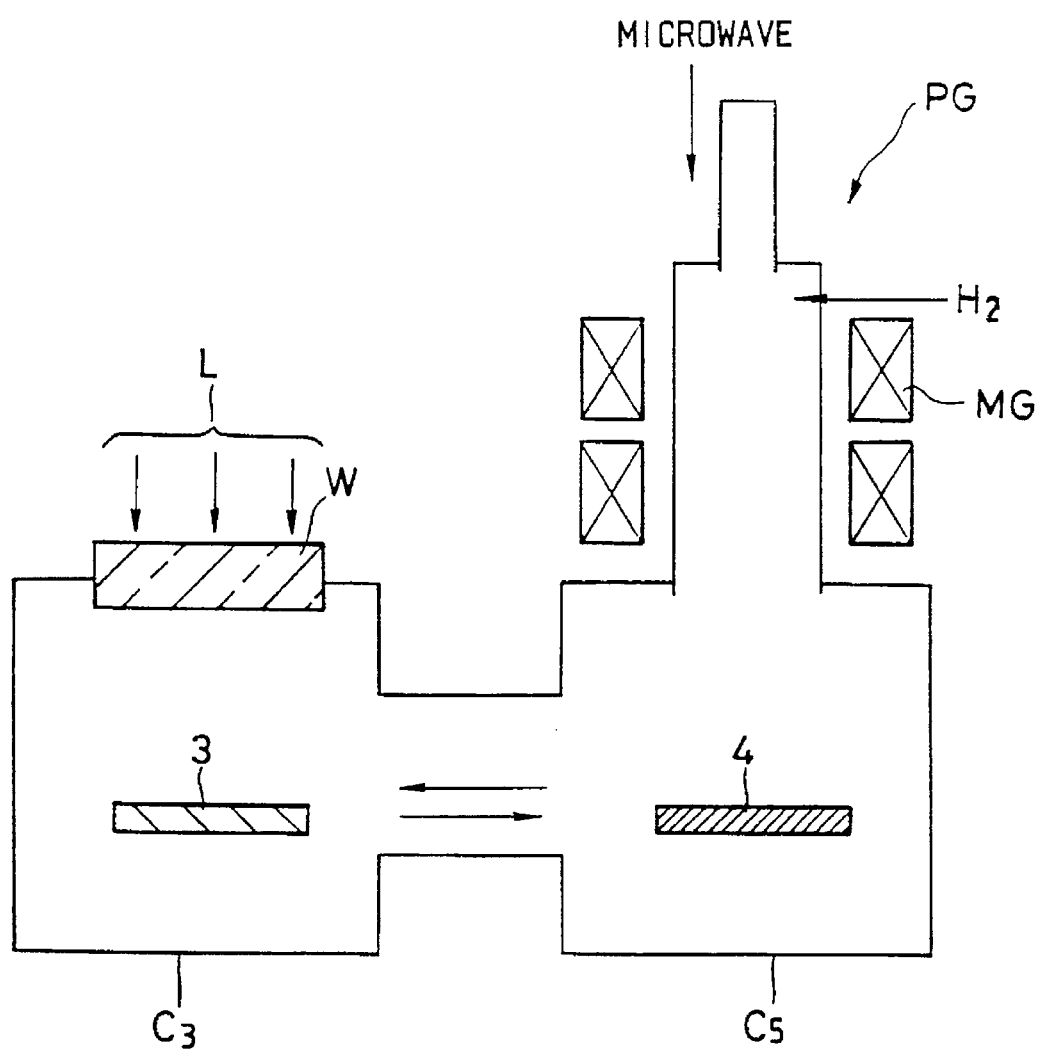
FIG. 19 is a schematic view of an apparatus for fabricating a thin film semiconductor device which is used in a seventh embodiment of the invention.

FIG. 19 shows a thin film semiconductor device fabricating apparatus used in the seventh embodiment. As shown in FIG. 19, the apparatus includes a plasma gun PG using electron cyclotron resonance (ECR) to generate a hydrogen plasma, and the hydrogenating chamber $C_5$ for effecting plasma hydrogenation with the hydrogen plasma generated by the plasma gun PG. MG denotes an electromagnet. Except for these, the apparatus has the same arrangement as that of the apparatus shown in FIG. 14, of which explanation is omitted here.

With the apparatus shown in FIG. 19 having the arrangement, a laser beam L is irradiated in the laser annealing chamber $C_3$ to the a-Si:H thin film 3 already formed on the glass wafer 1 to cause melting-recrystallization thereof. After that, without breaking the vacuum, the glass wafer 1 is transported to the hydrogenating chamber $C_5$. In the hydrogenating chamber $C_5$, the polycrystalline Si thin film 4 made by the melting-recrystallization is subjected to plasma hydrogenation with the hydrogen plasma generated by the plasma gun PG.

The seventh embodiment, like the fourth embodiment, precludes extraordinary changes in electrical conductivity by plasma hydrogenation of the polycrystalline Si thin film 4, and also provides the following additional advantage. That is, since the seventh embodiment excites hydrogen gas into a hydrogen plasma by utilizing excitation by microwaves and resonant phenomenon by the electromagnet MG, it can elevate the hydrogen gas exciting efficiency and hence increases the efficiency of plasma hydrogenation. Plasma hydrogenation utilizing ECR also enables plasma hydrogenation under a pressure as low as 10 mTorr or less, which would be difficult to realize with an ordinary plasma hydrogenation process.

Next explained is an eighth embodiment of the invention.

Figure 20:
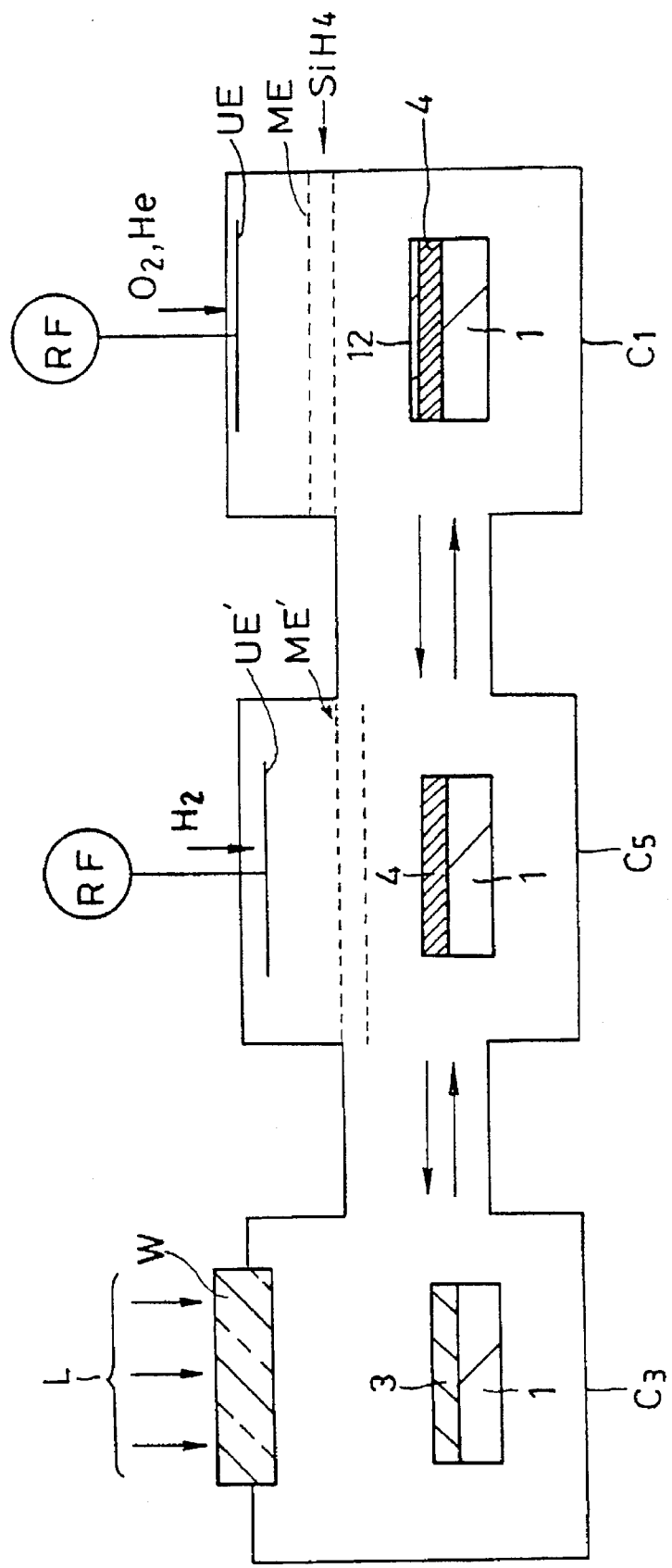
FIG. 20 is a schematic view of an apparatus for fabricating a thin film semiconductor device which is used in an eighth embodiment of the invention.

FIG. 20 shows a thin film semiconductor device fabricating apparatus used in the eighth embodiment. As shown in FIG. 20, in the apparatus, a CVD chamber $C_1$ for producing an insulating film is additionally coupled by a vacuum transporting mechanism (not shown) to the hydrogenating chamber $C_5$ of the apparatus shown in FIG. 18 as used in the sixth embodiment. The lower electrode in the CVD chamber $C_1$ is a mesh electrode ME. While introducing gases necessary for producing an insulating film to the CVD chamber $C_1$, high frequency power is to be applied to the upper electrode UE to generate a plasma between the upper electrode UE and the mesh electrode ME to conduct remote plasma CVD.

With the apparatus shown in FIG. 20 having the arrangement, a laser beam L is irradiated in the laser annealing chamber $C_3$ to the a-Si:H thin film 3 already formed on the glass wafer 1 to cause melting-recrystallization thereof. After that, without breaking the vacuum, the glass wafer 1 is transported to the hydrogenating chamber $C_5$. In the hydrogenating chamber $C_5$, remote plasma hydrogenation of the polycrystalline Si thin film 4 obtained by the melting-recrystallization is performed by the hydrogen plasma generated between the upper electrode UE' and the mesh electrode ME'. After that, without breaking the vacuum, the glass wafer 1 is again transported to the CVD chamber $C_1$. In the CVD chamber $C_1$, an $SiO_2$ film 12, for example, is produced on the polycrystalline Si thin film 4 by a remote plasma CVD process using a plasma generated between the upper electrode UE and the mesh electrode ME.

The eighth embodiment thus conducts plasma hydrogenation of the polycrystalline Si thin film 4 while maintaining its surface clean after obtaining the polycrystalline Si thin film 4 by melting-recrystallization of the a-Si:H thin film 3, and produces the $SiO_2$ film 12 on the polycrystalline Si thin film 4 while maintaining its surface clean after plasma hydrogenation of the polycrystalline Si thin film 4. Therefore, it can precludes extraordinary changes in electrical conductivity by plasma hydrogenation of the polycrystalline Si thin film 4, and can make a clean and high-quality polycrystalline Si/$SiO_2$ interface.

FIGS. 21A through 21H show a p-channel polycrystalline Si TFT fabricating method according to a ninth embodiment of the invention.

Figure 21A:
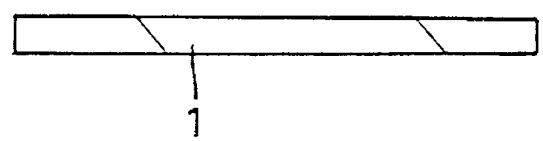
FIGS. 21A, 21B, 21C, 21D, 21E, 21F, 21G and 21H are cross-sectional views for explaining a method for fabricating a p-channel polycrystalline Si TFT according to a ninth embodiment of the invention.

The method according to the ninth embodiment first prepares, as shown in FIG. 21A, a glass wafer 1 cleaned by, for example, ultrasonic organic cleaning.

Figure 21B:
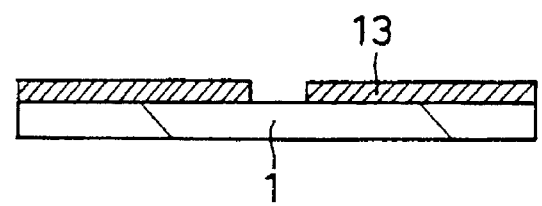

Next, as shown in FIG. 21B, a B-doped a-Si:H film (hereinafter called "a-Si:H, B thin film") 13 is produced on the glass wafer 1 by an ordinary plasma CVD process, and it is patterned to remove a portion corresponding to the channel portion by photolithography and etching.

Figure 21C:
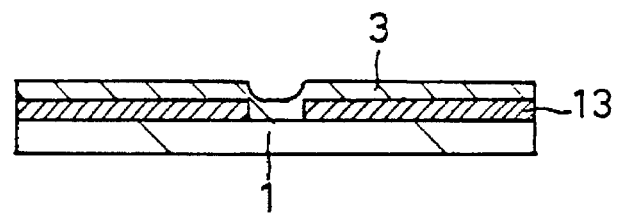

Next, as shown in FIG. 21C, the a-Si:H thin film 3 is produced by an ordinary plasma CVD process.

Figure 21D:
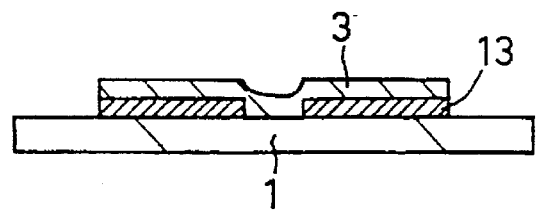

The a-Si:H, B thin film 13 and the a-Si:H thin film 3 are then patterned into islands by, for example, a dry etching method as shown in FIG. 21D.

Figure 21E:
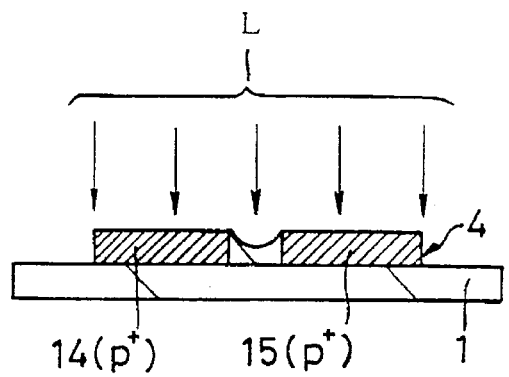

The glass wafer 1 shown in FIG. 21D is then put in the laser annealing chamber $C_3$ of the apparatus shown in FIG. 20. In the laser annealing chamber $C_3$, a laser beam L by, for example, an excimer laser is irradiated to the a-Si:H, B thin film 13 and the a-Si:H thin film 3 to make them change into the polycrystalline Si thin film 4 due to melting-recrystallization as shown in FIG. 21E. In this process, B atoms in the a-Si:H, B thin film 13 are doped to the polycrystalline Si thin film 4 except for the channel portion thereof to form a source region 14 and a drain region 15 of a $p^+$-type, for example. The laser beam L used here may be generated by, for example, a XeCl excimer laser (wavelength of 300 nm) or a laser beam by a KrF excimer laser (wavelength of 248 nm).

After making the polycrystalline Si thin film 4 by the melting-recrystallization, the upper electrode UE is moved to above the glass wafer 1 in the laser annealing chamber $C_3$.

In the laser annealing chamber $C_3$, a hydrogen plasma is generated by introducing hydrogen gas and causing electrical discharge from the upper electrode UE by applying high frequency power thereto so as to carry out plasma hydrogenation of the polycrystalline Si thin film 4.

The glass wafer 1 shown in FIG. 21E is then transported to the CVD chamber $C_1$ for producing an insulating film in the apparatus shown in FIG. 20 without breaking the vacuum, that is, without exposing the glass wafer 1 to the outside air. In the CVD chamber $C_1$, a gate insulating film 7 made of, for example, $SiO_2$ is produced by a remote plasma CVD process as shown in FIG. 21F.

Figure 21F:
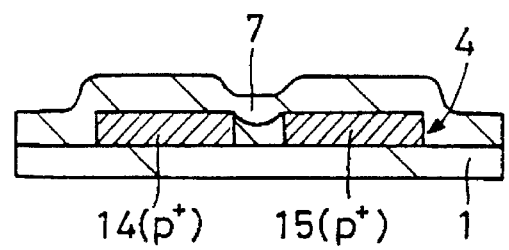
Figure 21G:
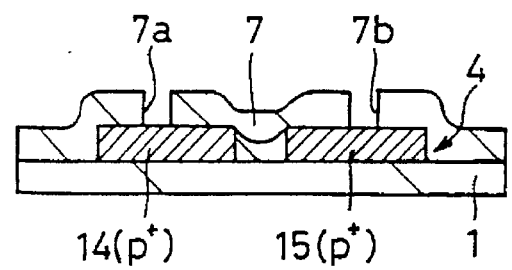

The glass wafer 1 shown in FIG. 21F is then taken out from the CVD chamber $C_1$ of the apparatus shown in FIG. 20 to the exterior, and the gate insulating film 7 is selectively removed by, for example, a wet etching process to make contact holes 7a, 7b as shown in FIG. 21G.

Figure 21H:
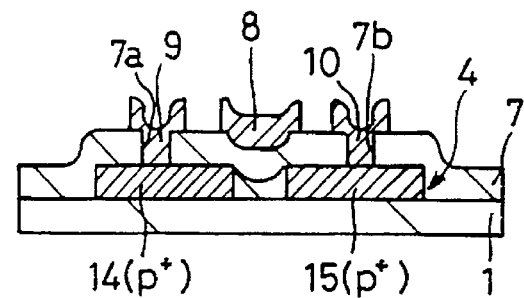

After that, an Al film, for example, is produced on the entire surface of the glass wafer 1 by, for example, a vacuum evaporation process, and subsequently patterned, for example, by a wet etching process to make the gate electrode 8, source electrode 9 and drain electrode 10 as shown in FIG. 21H. The Al film is, for example, 100 nm thick.

Thus a desired p-channel polycrystalline Si TFT is finished.

Figure 22:
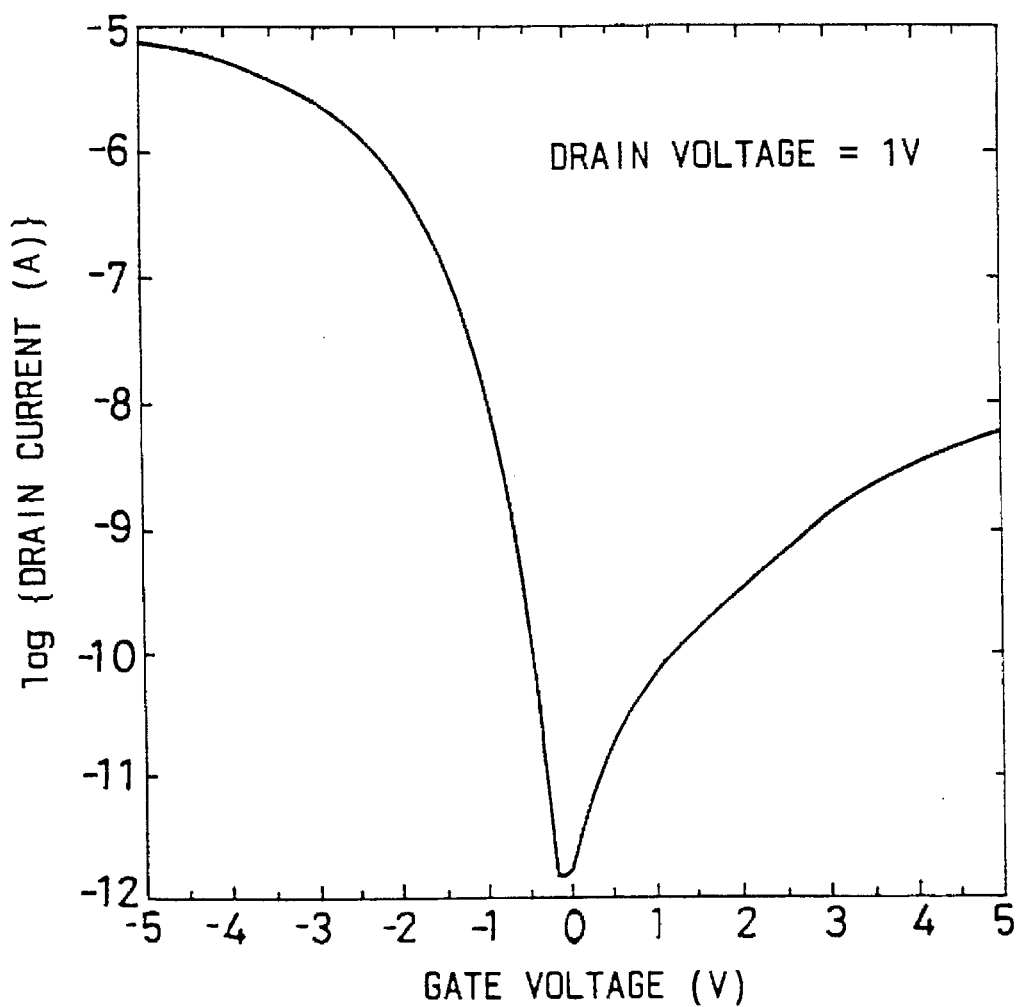
FIG. 22 is a graph showing a result of measurement of drain current-gate voltage characteristics of a p-channel polycrystalline Si TFT fabricated by the method according to the ninth embodiment of the invention.

FIG. 22 shows a result of measurement of drain current-gate voltage characteristics of the p-channel polycrystalline Si TFT thus fabricated where the gate width of the p-channel polycrystalline Si TFT is 20 nm, the gate length is 10 μm, the $SiO_2$ film making the gate insulating film 2 is 120 nm thick, and the drain voltage is 1 V. FIG. 21 shows that good characteristics having a threshold voltage as small as about −1.8 V because plasma hydrogenation of the polycrystalline Si thin film 4 does not cause any extraordinary changes in electrical conductivity.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the apparatus shown in FIG. 2 may include a chamber for chemical surface treatment or a film producing chamber using a method other than CVD, in addition to the CVD chambers $C_1$, $C_2$ and the laser annealing chamber $C_3$. The chemical surface treatment referred to here envisages plasma treatment such as plasma hydrogenation, gas flow treatment, photo-treatment and other like treatments. The film producing chamber using a method other than CVD envisages sputtering chamber, evaporating chamber, etc.

The apparatus as shown in FIG. 2, for example, may additionally include a photoresist producing chamber for producing a photoresist by plasma polymerization, etc. and a photoresist removing chamber for selectively removing exposed or non-exposed regions of the photoresist, or alternatively for removing the entirety of the photoresist regardless of exposure to light, such that formation and removal of photoresist patterns used for various kinds of patterning in the embodiments can be conducted continuously without exposing the glass wafer 1 to the outside air. Moreover, a CVD chamber for producing the a-Si:H, P film, an etching chamber and an evaporating chamber for producing the Al film may be added such that the polycrystalline Si TFT can be made without exposing the glass wafer 1 in the course of the fabricating process.

The apparatus may be also modified such that one treatment chamber thereof behaves as a plurality of different treating chambers such that all these treatments continuously proceed in the treatment chamber. The apparatus shown in FIG. 17 used in the fifth embodiment is an example thereof. As another example of the modification in this respect, the laser annealing chamber $C_3$ and the CVD chamber $C_1$ of the apparatus shown in FIG. 2 may be incorporated into a single treatment chamber having both functions thereof such that laser annealing and formation of the insulating film proceed continuously.

The invention is also adaptive to fabrication of a thin film semiconductor device by using one of various semiconductor thin films other than a Si film.

As described above, the invention can fabricate thin film semiconductor devices having a high performance and a high reliability with a good uniformity because it can make a clean and high-quality semiconductor/insulator interface.

Moreover, the invention can fabricate thin film semiconductor devices having a high performance and a good uniformity because it can hydrogenate a polycrystalline semiconductor thin film while maintaining the surface thereof clean.

What is claimed is:

1. A method for making a thin film semiconductor device, comprising the steps of:

(a) providing a substrate having a surface;

depositing an a-Si:H,P layer on said surface by plasma CVD;

(c) patterning and etching the a-Si:H,P layer to define a channel region;

(d) depositing an a-Si:H layer thereon;

(e) laser annealing to convert the a-Si:H,P and a-Si:H layers into a first polycrystalline Si layer having defined $n^+$-type source and drain regions and having a first crystal grain size;

(f) depositing a second a-Si:H layer on said first polycrystalline Si layer;

(g) laser annealing to convert the second a-Si:H and first polycrystalline Si layers into a second polycrystalline Si film having a second crystal grain size larger than said first crystal grain size;

(h) depositing a gate insulating layer thereon;

(i) patterning and etching to form islands;

(j) etching the gate insulating layer to define contact holes;

(k) depositing an electrode layer thereon; and (l) patterning and etching said electrode layer to define a source electrode, a drain electrode and a gate electrode, wherein each of steps (a)–(l) are performed in a multi-chambered apparatus, without being exposed to outside air.

2. A method as defined in claim 1, wherein steps (f) and (g) are repeated in order a plurality of times until a polycrystalline Si film layer of increased crystal grain size is obtained and thereafter, proceeding with step h).

3. A method for making a thin film semiconductor device, comprising the steps of:

(a) providing a substrate having a surface;

(b) depositing an a-Si:H,P layer on said surface by plasma CVD;

(c) patterning and etching the a-Si:H, P layer to define a channel region;

(d) depositing an a-Si:H layer thereon;

(e) laser annealing to convert the a-Si:H,P and a-Si:H layers into a polycrystalline Si film having defined $n^+$-type source and drain regions;

(f) depositing a gate insulating layer thereon;

(g) patterning and etching to form islands;

(h) etching the gate insulating layer to define contact holes;

(i) depositing an electrode layer thereon; and (j) patterning and etching said electrode layer to define a source electrode, a drain electrode and a gate electrode, (k) depositing an interlayer insulating film on said etched electrode layer;

(l) patterning and etching said interlayer insulating film to form contact holes aligned with said source, drain and gate electrodes;

(m) depositing a second electrode layer thereon; and (n) patterning and etching said second electrode layer to define an extended source electrode, an extended drain electrode and an extended gate electrode wherein each of steps (a)–(n) are performed in a multi-chambered apparatus, without being exposed to outside air.

* * * * *